United States Patent
Iyama et al.

(10) Patent No.: US 7,615,188 B2
(45) Date of Patent: *Nov. 10, 2009

(54) APPARATUS FOR MEASURING ABSORBED POWER

(75) Inventors: Takahiro Iyama, Yokohama (JP); Yoshiaki Tarusawa, Yokosuka (JP); Shinji Uebayashi, Yokohama (JP); Toshio Nojima, Sapporo (JP)

(73) Assignee: NTT DoCoMo, Inc., Tokyo (JP)

( * ) Notice: Subject to any disclaimer, the term of this patent is extended or adjusted under 35 U.S.C. 154(b) by 612 days.

This patent is subject to a terminal disclaimer.

(21) Appl. No.: 11/392,570

(22) Filed: Mar. 30, 2006

(65) Prior Publication Data

US 2006/0172432 A1    Aug. 3, 2006

Related U.S. Application Data

(62) Division of application No. 10/398,205, filed as application No. PCT/JP02/08125 on Aug. 8, 2002, now Pat. No. 7,186,377.

(30) Foreign Application Priority Data

| Aug. 8, 2001 | (JP) | ............................ 2001-240926 |
| Mar. 13, 2002 | (JP) | ............................ 2002-068521 |

(51) Int. Cl.
    *C12Q 1/68* (2006.01)
    *H04B 1/10* (2006.01)
    *G01N 27/00* (2006.01)

(52) U.S. Cl. .................... 422/50; 436/149; 455/226.2; 422/68.1; 422/80; 422/82.01; 343/701; 343/703; 343/718

(58) Field of Classification Search .................. 436/149; 455/226.2; 422/68.1, 80, 82.01; 343/701, 343/703, 718

See application file for complete search history.

(56) References Cited

U.S. PATENT DOCUMENTS 5,610,519 A    3/1997    Hankui et al.

(Continued)

FOREIGN PATENT DOCUMENTS

CA    2300303    1/2000

(Continued)

OTHER PUBLICATIONS

Kun-Mu Chen et al., "Measurement of induced electric fields in a phantom model of man" Radio Science, vol. 17, No. 5S, pp. 49S-59S, 1982.

(Continued)

*Primary Examiner*—Tony G Soohoo
*Assistant Examiner*—Robert Eom
(74) *Attorney, Agent, or Firm*—Oblon, Spivak, McClelland, Maier & Neustadt, L.L.P.

(57) ABSTRACT

In an apparatus for measuring absorbed power including an electromagnetic field probe 1 fixedly mounted within a head simulation phantom 2 which simulates the configuration and the electromagnetic characteristics of a head of a human body, and wherein the strength of an electric field or a magnetic field of a radio wave externally irradiated upon the head simulation phantom 2 is measured by the electromagnetic field probe 1, and the power of the radio wave absorbed by the head is estimated on the basis of measured values, the head simulation phantom 2 comprises a solid dielectric 10' which simulates the configuration and the electromagnetic characteristics of a head of a human body or a liquid dielectric 10 which simulates the electromagnetic characteristics of a head of a human body and which is filled in an enclosed vessel 10 which simulates the configuration of a head of a human body. The volume of the solid dielectric 10' or the volume of the enclosed vessel 11 is equal to or less than $5 \times 10^5$ mm$^3$.

10 Claims, 18 Drawing Sheets

U.S. PATENT DOCUMENTS

| | | | |
|---|---|---|---|
| 5,789,929 | A | 8/1998 | Hankui |
| 6,181,136 | B1 | 1/2001 | Choi et al. |
| 6,329,953 | B1 * | 12/2001 | McKivergan ............... 343/703 |
| 6,919,845 | B2 | 7/2005 | Ozaki et al. |
| 7,186,377 | B2 * | 3/2007 | Iyama et al. ................. 422/50 |

FOREIGN PATENT DOCUMENTS

| | | |
|---|---|---|
| JP | 10-185838 | 7/1998 |
| JP | 10-311805 | 11/1998 |
| JP | 11-142351 | 5/1999 |
| JP | 2001-124707 | 5/2001 |
| WO | 93-15470 | 8/1993 |

OTHER PUBLICATIONS

Kun-Mu Chen et al., "Induced EM fields inside human bodies irratiated by EM waves of up to 500MHz", The Journal of Microwave, vol. 12, No. 2, pp. 173-183, 1977.

Hiroshi Tamura, et al., A Dry Phantom Material Composed of Ceramic and Graphite Powder:, IEEE Transactions of Electromagnetic Compatibility, vol. 39, No. 2, May 1997, pp. 132-137.

Karl S. Kunz, et al., Finite Difference Time Domain Method for Electromagnetics:, CRC PRess 1993, 4 pages.

Takahiro Iyama, et al., "Fundamental Design and Characteristics of Local SAR Estimation System Using Fixed E-field Probe", The Institute of Electronics, Technical Report of IEICE, vol. 100, No. 363, Oct. 2000, pp. 47-52 (with English Abstract).

Patent Abstracts of Japan , JP 10-311805, Nov. 24, 1998.

Patent Abstracts of Japan, JP 10-185838, Jul. 14, 1998.

Patent Abstracts.of Japan, JP 11-142351, May 28, 1999.

U.S. Appl. No. 11/873,934, filed Oct. 17, 2007, Kiminami, et al.

* cited by examiner

APPARATUS FOR MEASURING ABSORBED POWER

CROSS-REFERENCE TO RELATED APPLICATIONS

This application is a divisional of U.S. patent application Ser. No. 10/398,205 filed Apr. 7, 2003, now U.S. Pat. No. 7,186,377, which is the National Stage of PCT/JP02/08125, filed Aug. 8, 2002, and in turn claims priority to Japan Patent Applications 2001-240926 filed Aug. 8, 2001 and 2002-68521, filed Mar. 13, 2002 the entire contents of each of which are hereby incorporated herein by reference.

TECHNICAL FIELD

The present invention relates to an apparatus which uses a phantom simulating the electromagnetic characteristics of a human body to measure the amount of absorption by the human body of a radio wave or waves radiated from a radio transmitter which is operated in the vicinity of the body through a relative scan of the phantom and the radio transmitter.

BACKGROUND ART

In the prior art practice, the power absorbed by a human body, for example, by the head of the human body, has been estimated by constructing a head simulation phantom which simulates the configuration and the electromagnetic characteristics of the head of the human body and measuring the amount of power absorbed by the phantom.

A conventional example of the prior art will be described with reference to FIG. 1. A head simulation phantom 2 is constructed by forming a recess 12 configured to divide the head of the human body into two equal parts laterally in a top surface of a vessel 11 and filling the recess 12 with a liquid medium 10 which simulates the electromagnetic characteristics of the head. By way of example, the liquid medium for a 900 MHz solution comprises 56.5% of sucrose, 40.92% of deionized water, 1.48% of sodium chloride, 1.0% of hydroxyl cellulose and 0.1% of bactericide as disclosed in a literature IEC/PT62209, "Procedure to Determine the Specific Absorption Rate (SAR) for Hand-held Mobile Telephones" or the like. A radio transmitter 3 which represents a radio wave radiation source is secured to the bottom surface of the vessel 11 on the outside thereof at a location central of the vessel 11 or which corresponds to the ear of the head of the human body. An electromagnetic field probe 1 which detects an electric or a magnetic field is inserted into the liquid medium 10 and is scanned in a plane which opposes the radio transmitter 3. In this instance, the head simulation phantom 2 and the radio transmitter 3 are separately secured and only the electromagnetic field probe 1 is moved as indicated by arrows 8 for purpose of scan. A resulting detected value of the electromagnetic field probe 1 is squared, and the squared value is multiplied by a calibration facter to determine the absorbed power which occurs within the head simulation phantom 2. Broken lines 6, shown laterally offset, represent the locus of scan of the probe 1, and this corresponds to the measurement of absorbed power from the radio wave in a situation that the mobile telephone is located close to the ear of the head of the human body during the transmission and reception with the antenna (not shown) of the radio transmitter 3 extending in a direction through the casing of the radio transmitter 3 which runs substantially parallel to the bottom surface of the vessel 11.

The head simulation phantom 2 shown in FIG. 1 is filled with the liquid medium 10, and is inconvenient in its handling. Since the probe 1 is moved within the liquid medium 10 for purpose of scan and measurement, the liquid medium 10 remains open to the air, and there arises a problem that the liquid medium 10 may be evaporated to cause an aging effect of the electromagnetic characteristics thereof.

Another example of the prior art will be described with reference to FIG. 2. A head simulation phantom 2 which simulates the configuration and the electromagnetic characteristics of the head of the human body is constructed, and an electromagnetic field probe 1 is inserted into an opening 21 formed in the phantom 2. The electromagnetic field probe 1 is located close to the ear of the head simulation phantom 2, while a radio transmitter 3 which represents a radio wave radiation source is positioned on the external surface of the head simulation phantom 2 close to the ear. The transmitter 3 is moved vertically and back-and-forth, as indicated by arrows 8, for purpose of two-dimensional scan while deriving a detected value from the electromagnetic probe 1, and multiplying a calibration factor to the square of the detected value to determine the absorbed power. The locus of scan for this case is illustrated by broken line 6, shown laterally offset. It is assumed in FIG. 2 that a mobile telephone is used as the radio transmitter 3 with an antenna extended from the telephone case to simulate the manner of use of a mobile telephone.

The phantom 2 shown in FIG. 2 simulates the head of the human body by a spherical solid dielectric 10' or by a liquid dielectric (liquid medium) 10 which fills the interior of a spherical vessel. The solid dielectric 10' has a dielectric constant $\in r'=52$ and a dielectric loss $\tan\delta=55\%$ (at 900 Mhz), for example, and comprises 57% of polyvinylidene fluoride, 10% of ceramic powder and 33% (volume %) of graphite powder, as disclosed in a literature by H. Tamura, Y. Ishikawa, T. Kobayashi and T. Nojima "A Dry Phantom Material Composed of Ceramic and Graphite Powder," IEEE Trans. Electromagn. Compat., Vol. 39, No. 2, pp 132-137, May 1997 or the like.

Assuming that the head phantom2 is formed with a size simulating the head of the human body, or with a sphere having a diameter of 200 mm, it contains a volume of $4\times\pi\times\{(200/2)mm\}^3/3$. The dielectric which simulates the electromagnetic characteristics of the head of the human body has a density which is equal to about $0.002g/mm^3$ for the solid dielectric 10' and which is equal to about $0.001g/m^3$ for the liquid dielectric (liquid medium). Accordingly, the head simulation phantom 2 has a weight which is equal to the volume $4\times\pi\times\{(200/2)mm\}^3/3$ multiplied by the density $0.002g/mm^3$ or 8400 g for the solid dielectric 10'. Since the liquid dielectric 10 has a density which is nearly one-half that of the solid dielectric 10', the phantom will have a weight which is nearly one-half that of the solid dielectric 10' phantom. Thus, a conventional head simulation phantom 2 has a weight which is as high as 4200g or 8400g, and presented an inconvenience in its handling and transportation.

The purpose of measuring the absorbed power is to know how much of a radio wave is absorbed by the human body during the use of a mobile telephone or a transceiver, and the measurement takes place in a so-called near field in which a distance from a radio wave radiation source to the phantom 2 is normally very small. As a consequence, there is a great influence that the reproducibility of positional relationship between the radio transmitter 3, the head simulation phantom 2 and the electromagnetic field probe 1 has upon the reproducibility of results of measurement. In other words, if there is a relatively small shift in the relationship, there occurs a change in the reflection characteristic of the phantom 2, producing a change in the distribution of the radiated electromagnetic field. If the radio transmitter 3 is held by the hand 4' of a measuring personnel as indicated in FIG. 3, it is difficult to maintain a correct position of the transmitter relative to the phantom 2, and a good reproducibility of measured values cannot be guaranteed. There also occur influences that the radio wave radiated from the radio transmitter 3 is absorbed by the hand 4' of the measuring person and that the current distribution on the antenna 5 of the radio transmitter 3 may be changed due to the hand 4' of the measuring personnel. Where the radio transmitter has a bulky volume or heavy, it may be difficult to conduct a spatial scan of the radio transmitter 3 relative to the phantom 2 by hand 4'.

Conversely, if the radio transmitter 3 is fixed while the absorbed power measuring assembly 7 comprising the head simulation phantom 2 and the electromagnetic field probe 1 scans through a two-dimensional movement relative to the radio transmitter 3, it is a troublesome operation to perform the measurement by manually moving and scanning the absorbed power measuring assembly 7 when the head simulation phantom 2 has a weight which is as high as 4200g or 8400g as described above.

It is an object of the present invention to provide an apparatus for measuring absorbed power which permits a scan through a relative movement between an absorbed power measuring assembly comprising a simulation phantom and an electromagnetic field probe and a radio transmitter to be performed in a relatively simple manner.

DISCLOSURE OF THE INVENTION

According to one aspect of the present invention, in an apparatus for measuring absorbed power in which an electromagnetic field probe is inserted inside a phantom which simulates the configuration and the electromagnetic characteristics of part of a human body, and the field strength of an electric field or a magnetic field of a radio wave which is externally irradiated upon the simulation phantom is measured, and the power of the radio wave which is absorbed by the part of the human body is estimated on the basis of measured values, the simulation phantom has a volume which is equal to $5 \times 10^5$ mm$^3$ or less.

More preferably, at least part of the simulation phantom which is disposed opposite to the radio transmitter is coated by a spacer comprising a material of a lower dielectric constant than the phantom.

According to another aspect of the present invention, in an apparatus for measuring absorbed power in which an electromagnetic field probe is inserted inside a phantom which simulates the electromagnetic characteristics of a human body, the field strength of an electric field or a magnetic field of a radio wave which is externally irradiated upon the phantom is measured by the electromagnetic field probe, and the power of the radio wave which is absorbed by the human body is estimated on the basis of measured values, there is provided a scan mechanism which performs a relative movement between the phantom and the radio transmitter.

BEST MODES OF CARRYING OUT THE INVENTION

First Invention

Figure 2:
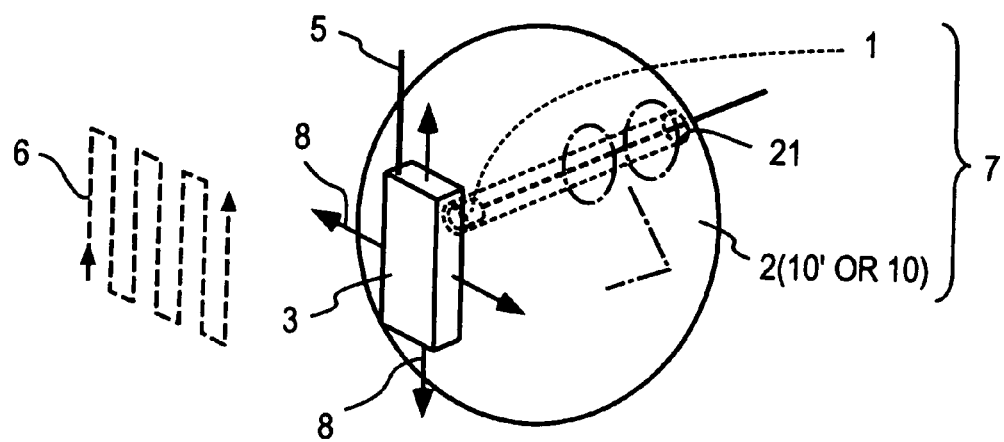
FIG. 2 is a perspective view of a conventional apparatus for measuring absorbed power in which an electromagnetic probe is inserted inside a head simulation phantom and an absorbed power measuring assembly is fixed while spatially scanning a radio transmitter.
Figure 3:
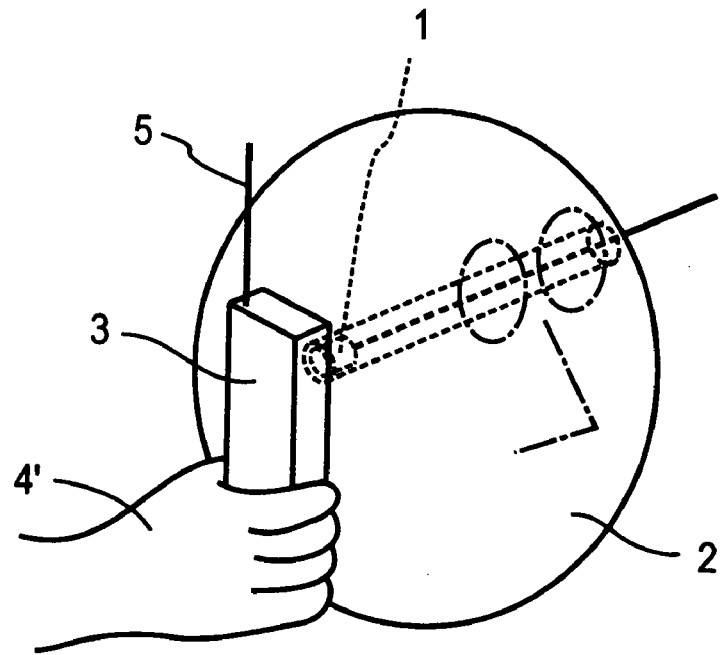
FIG. 3 is a perspective view of a conventional apparatus for measuring absorbed power in which a radio transmitter is manually held by a measuring personnel for purpose of scan.

The principle of one aspect of the present invention will be described first. When the head simulation phantom 2 which simulates the configuration and the electromagnetic characteristics of the head of the human body shown in FIG. 2 is irradiated with a radio wave in SHF band, which represents a transmission frequency of a mobile telephone, or with a radio wave of a higher frequency band, the absorption of the power by the phantom 2 takes place in a manner indicated in FIG. 4. As shown, the absorption will be greater in a surface layer 2a of the head simulation phantom 2 which is located close to the radio transmitter 3, but will be reduced in the inner thin layer 2b, and will be substantially equal to zero in the inside 2c. Specifically, when a half-wavelength dipole antenna is disposed at a distance of 10 mm with respect to the phantom 2 having a diameter of 200 mm, for example, and a radio wave (of frequency 900 MHz) is irradiated upon the phantom 2, it follows that denoting the absorption of the power of the radio wave which occurs at the surface of the phantom 2 by 1, the absorption at a point which is removed 20 mm from the surface of the phantom will be reduced to $\frac{1}{10}$, and will be reduced to $\frac{1}{100}$ when removed 50 mm. In this manner, most part of the phantom is not concerned with the measurement of absorbed power except for a very small portion which is located very close to the surface of the head simulation phantom 2. According to one aspect of the present invention, an advantage is taken of this by reducing the volume and the weight of the head simulation phantom 2. If there is a significant amount of absorption of the radio wave at a location disposed deep inside the phantom 2, a reduction in the volume of the phantom 2 will result in removing an internal portion where the absorption of the radio wave is occurring to prevent the measurement from the inner portion. However, such likelihood is eliminated since the absorption of the radio wave occurs only a portion thereof which is located close to the surface. It is to be noted that eyes and nose displayed in phantom lines in FIG. 4 merely indicate that this phantom simulates the head.

The fact that there is no problem when the volume of the phantom 2 is reduced will be discussed below.

Figure 5:
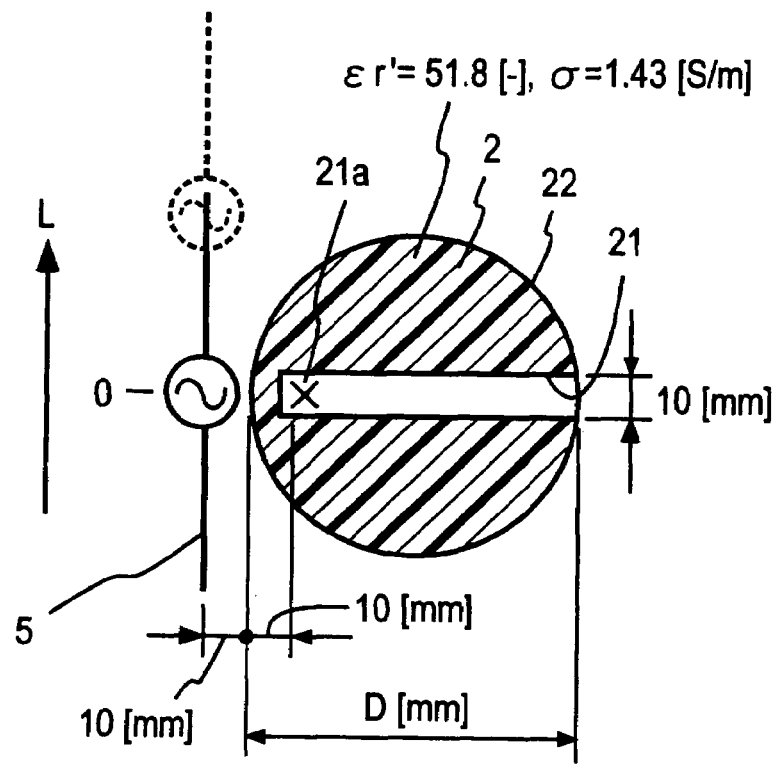
FIG. 5 shows a layout of a calculation model including a head simulation phantom and a half-wavelength dipole antenna acting as a radio wave radiating source in order to calculate a distribution of the electromagnetic field within the phantom.
Figure 6:
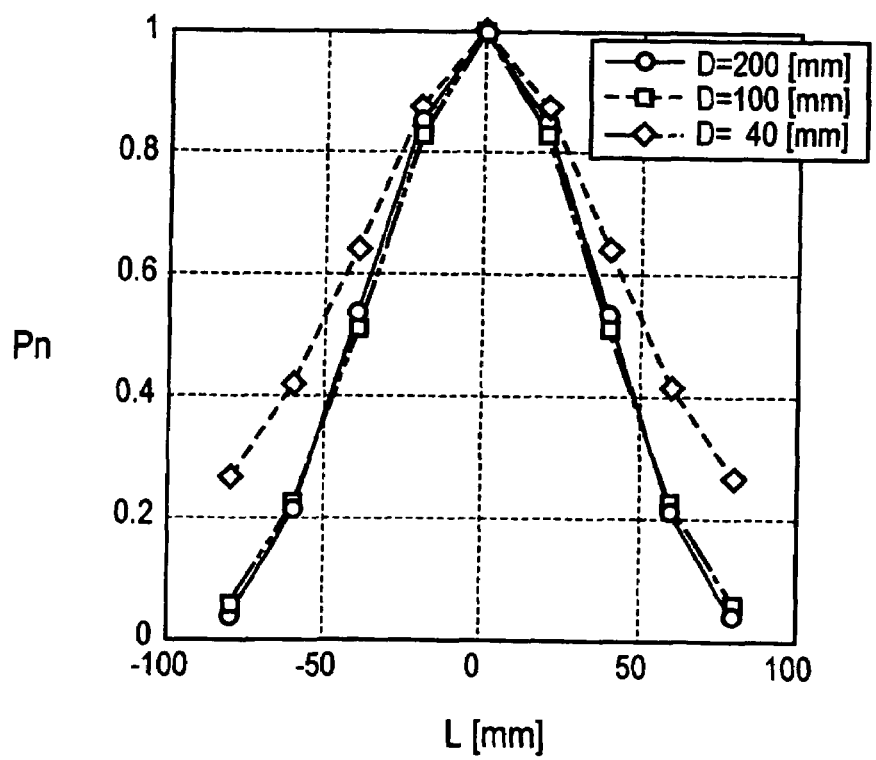
FIG. 6 graphically shows a normalized power calculation value at the location of the electromagnetic field probe which is to be disposed inside the head simulation phantom, plotted against an antenna position as measured along the length of the antenna.

A model is considered as illustrated in FIG. 5. A sphere having a diameter of Dmm, a dielectric constant $\in r'=51.8$ and a conductivity $\sigma=1.43 S/m$ is used as a head simulation phantom 2. The phantom 2 is formed with a probe insertion opening 21 which extends from a point on the surface through the center to a point close to the opposite surface. The probe insertion opening 21 has a diameter of 10 mm, and it is assumed that a distance from the inner end of the opening to the surface of the head simulation phantom 2 is equal to 10 mm. A half-wavelength dipole antenna 5 is vertically disposed at a location which is spaced by 10 mm from the surface of the head simulation phantom 2 which opposes the inner end of the probe insertion opening 21. FIG. 6 graphically shows a result of calculation for a normalized power Pn (as referenced to the power which prevails for L=0), plotted against the height Lmm when the half-wavelength dipole antenna 5 is moved vertically up and down from a reference point where the feed point is located opposite to the inner end 21a. The normalized power at the location where the electromagnetic field probe 1 is disposed or at the inner end 21a of the probe insertion opening 21 can be calculated according to the finite-difference time-domain method (see, for example, "Finite Difference Time Domain Method for Electromagnetics," Karl S. Kung and Raymond J. Luebbers, CRC Press 1993 or the like). It is to be noted that the input power to the half-wavelength dipole antenna 5 is maintained constant, and the frequency of the radiated wave is 900 MHz. A curve which links ○ plots corresponds to a diameter D of the phantom 2 which is equal to 200 mm (conventional one), a curve which links □ plots corresponds to a diameter D equal to 100 mm, and a curve which links ◇ plots corresponds to D equal to 40 mm.

It will be seen that the normalized power distribution for D=100 mm is substantially similar to the normalized power distribution of the conventional phantom in which D=200 mm. Thus, it is considered that if the diameter of the head simulation phantom 2 is reduced to one-half the conventional value, or if the volume and the weight are reduced to ⅛ times the conventional value, it is still possible to simulate the head of a human body. When the head simulation phantom 2 having D=100 mm is manufactured, the volume will be $4\times\pi\times\{(100/2) \text{ mm}\}^3/3 = 5\times10^5 \text{ mm}^3$, and its weight will be $4\times\pi\times\{(100/2) \text{ mm}\}^3/3 = 5\times10^5 \text{ mm}^3$ multiplied by 0.002g/mm³ or 1000 g when the solid dielectric 10' is used, and the weight will be further reduced to one-half when the liquid medium 10 is used. The weight of the head simulation phantom 2 which is on the order of 500g or 1000 g means that a measuring personnel can easily handle the phantom 2 and move it for purpose of scan. When the diameter D is reduced to one-fifth or D=40 mm, the normalized power which is substantially equal to the conventional one having D=200 mm can be obtained if L is located within 20 mm. However, when the value of L increases to the order of 60 mm, the normalized power will be nearly twice the normalized power obtained with the conventional one having D=200 mm. The tendency that the normalized power increases above the value obtained with a conventional one having D=200 as the distance between the probe 1 and the antenna feed point increases occurs for a diameter D which is equal to or less than 100 mm. However, if the required range of measurement L is small, there is no problem. When the range of measurement L increases, it is possible to reduce the weight and the cost required even though the accuracy of measurement is degraded. It is to be noted that with a phantom having a diameter D which is equal to or greater than 100 mm, there is a less contribution to reducing the weight and the cost required even though a higher accuracy can be obtained.

Figure 7A:
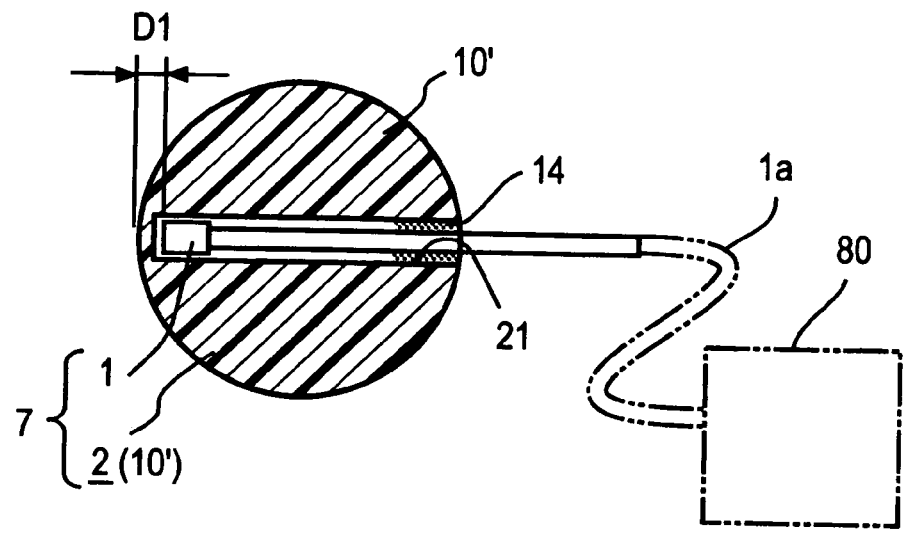
FIG. 7A is a cross section showing an example of an absorbed power measuring assembly with the apparatus according to the invention which uses a solid dielectric 10'.

Consequently, in an embodiment of the present invention, a phantom 2 which simulates the configuration and the radio wave absorption characteristics of part of the human body or the head in the example to be described below comprises a phantom 2 as shown in FIG. 7A in which a sphere is formed with the solid dielectric 10' comprising the materials mentioned above in connection with FIG. 2, for example. In particular, the volume of the phantom 2 is chosen to be equal to or less than ⅛ times the volume of part of the human body being simulated, or the volume of the normal head of the human body or $5\times10^5 \text{ mm}^3$. The less the volume of the phantom 2, the better in respect of reducing the weight, even though the accuracy of measurement becomes degraded as mentioned above. Accordingly, a minimum value for the volume of the phantom 2 may be chosen to be a volume which permits at least the probe 1 to be contained even though the accuracy of measurement may be degraded to a degree. A probe insertion opening 21 is formed extending from a point on the surface of the phantom 2 and extending to another point located close to the surface, and an electromagnetic field probe 1 is inserted into the probe insertion opening 21. For example, an adhesive 14 is filled into the probe insertion opening 21, thus securing the electromagnetic field probe 1 within the phantom 2 to be integral therewith.

Figure 4:
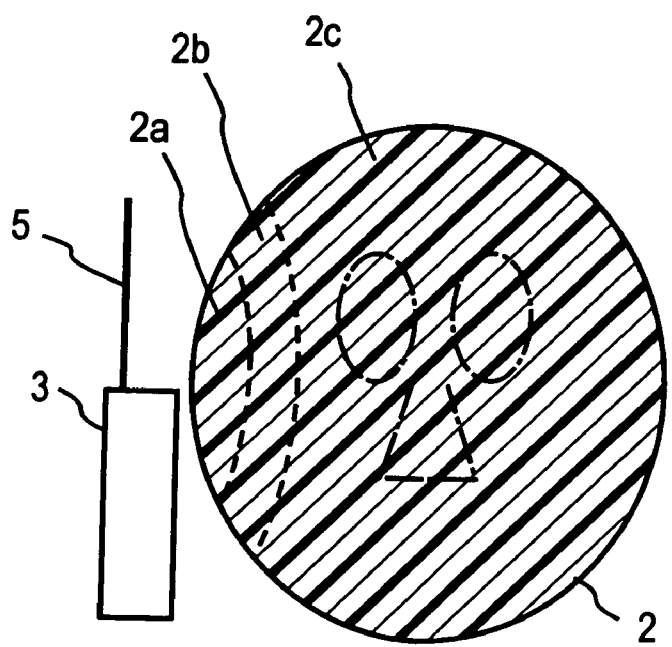
FIG. 4 illustrates a power absorption by a head simulation phantom.

It will be seen from the above description with reference to FIG. 4 that a spacing D1 between the electromagnetic field probe 1 and the closest surface of the phantom 2 be preferably within 20 mm, in particular, within 10 mm in order to achieve a certain accuracy of measurement. While it is preferred to have a smaller value for D1, a suitable value is chosen in consideration of the ease of manufacture and a resistance to fracturing. As indicated by single dot chain lines in this Figure, a lead wire 1a of the probe 1 is connected to a calculation and display unit 80 in the similar manner as a conventional apparatus of this kind, and the calculation and display unit 80 calculates and displays the absorbed power using the values detected by the probe 1 and using the absorption effect.

Figure 1:
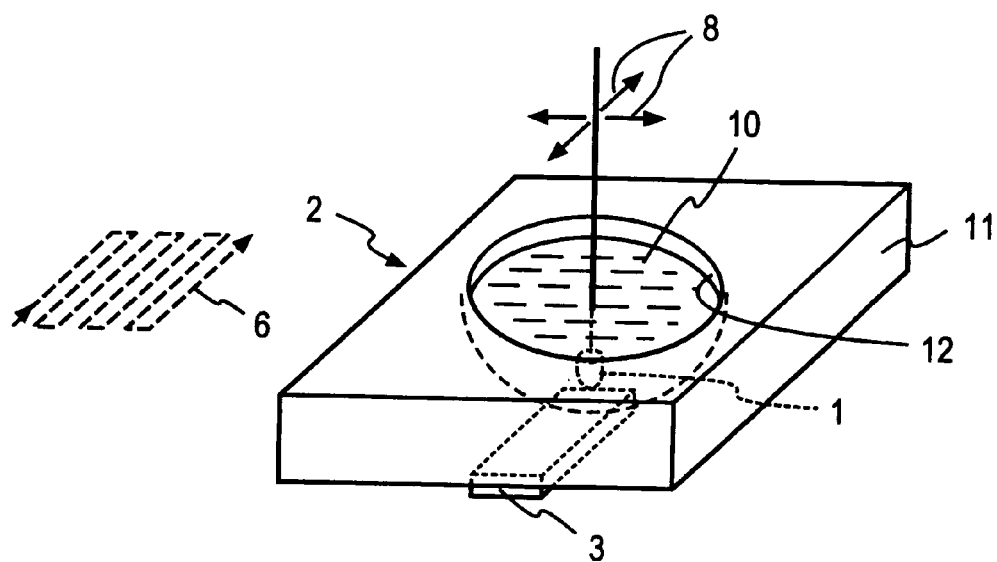
FIG. 1 is a perspective view of a conventional apparatus for measuring absorbed power using a head simulation phantom in which a liquid dielectric (liquid medium) is used.
Figure 7B:
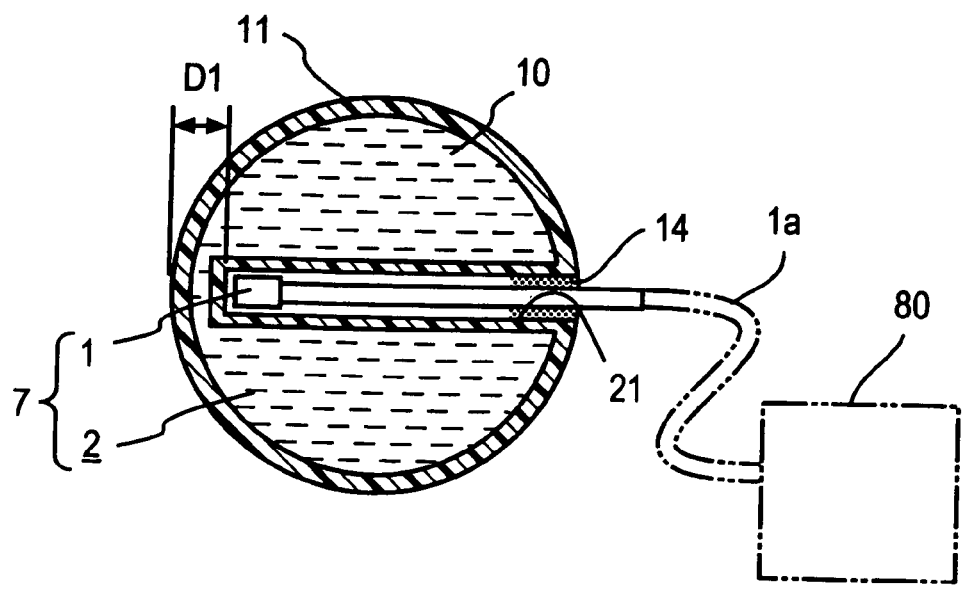
FIG. 7B is a cross section showing an example of an absorbed power measuring assembly in the apparatus of the invention which uses a liquid medium 10.

As shown in FIG. 7B, a head simulation phantom 2 may be constructed using a confined vessel 11 which simulates the configuration of the head and a liquid medium 10 which fills the vessel 11. The liquid medium 10 may be similar to that mentioned previously in connection with FIG. 1. In this instance, the volume of the phantom 2 is again chosen to be equal to or less than ⅛ times the volume of the normal head of the human body or $5\times10^5 \text{ mm}^3$. The confined vessel 11 is formed with a probe insertion opening 21 in the similar manner as in FIG. 7, into which an electromagnetic field probe 1 is inserted and may be secured by using an adhesive 14, for example, to be integral with the phantom 2. The vessel 11 is formed of a material such as acrylic resin or Teflon (registered trademark) having a low dielectric constant which is close to that of the air pereferably, thus preventing the distribution of a radio wave radiated from a radio transmitter 3 (not shown) from being disturbed. In FIGS. 7A and 7B, in order to connect the electromagnetic field probe 1 to be integral with the phantom 2, other techniques than filling the adhesive 14 into the probe insertion opening 21 may be used to secure them together.

Figure 8:
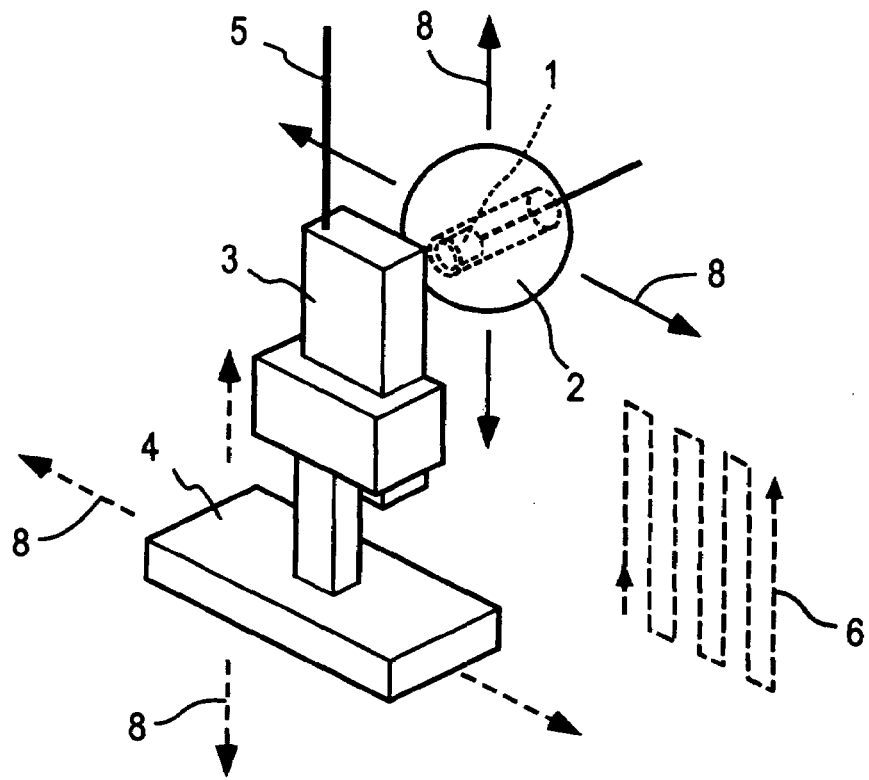
FIG. 8 is a perspective view illustrating the set-up in which a radio transmitter is fixed while an absorbed power measuring assembly according to the invention performs a spatial scan.

The spherical head simulation phantom 2 shown in FIGS. 7A and 7B has its volume reduced to or less than $5\times10^5 \text{ mm}^3$ which corresponds to ⅛ times the volume of the conventional phantom which represents the size of the head of the human body, and the weight is reduced to or less than ⅛ times the weight of the conventional phantom, and thus is greatly reduced in weight. The weight will be equal to or less than 500 g when the liquid medium 10 is used, and will be equal to or less than 1000 g when the solid dielectric 10' is used. Accordingly, while the radio transmitter 3 is retained by and fixed on a retainer 4 as illustrated in FIG. 8, a measuring personnel can hold the phantom 2 by one hand and easily move it in the directions indicated by solid line arrows 8 in proximity to the radio transmitter 3 for purpose of scan. The locus of scan 6 of the probe 1 is shown offset in this Figure. Alternatively, the phantom 2 may be fixed while the radio transmitter 3 may be moved in directions indicated by broken line arrows 8. The normalized power distribution will be substantially similar to the normalized power distribution of a conventional arrangement where D=200 mm. The volume of the solid dielectric 10' or the volume of the confined vessel in which the liquid medium 10 is filled, which constitutes the head simulation phantom, is reduced, thus reducing the cost of materials and the manufacturing cost by a corresponding amount. In addition, because the phantom 2 is integral with the electromagnetic field probe 1, the relative positional relationship therebetween is easily reproducible during the scan movement.

Figure 9:
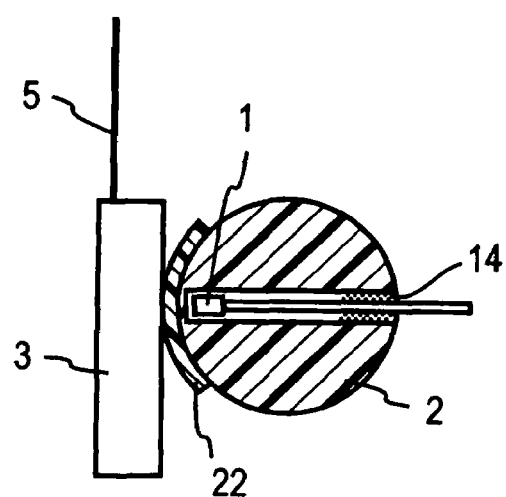
FIG. 9 is a cross section showing an example in which a spacer is applied to part of a phantom.
Figure 10:
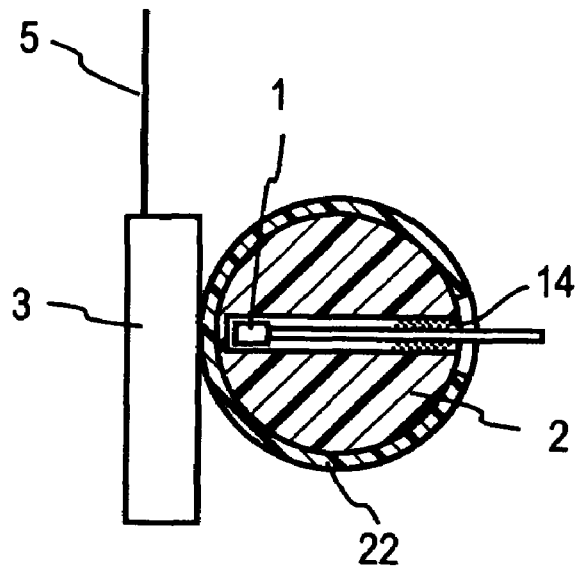
FIG. 10 is a cross section showing an example in which the entire surface of the phantom is covered by a spacer.

FIG. 9 shows another embodiment of the invention. In this embodiment, at least a portion of the surface of the head simulation phantom 2 shown in FIG. 7 which is located close to the radio transmitter 3 or the surface portion located close to the location of the electromagnetic field probe 1 is coated by a thin spacer 22. The spacer 22 may be adhesively secured or detachably mounted using a tacky bonding agent or may be detachably mounted by fitting by choosing its configuration. As shown in FIG. 10, the spacer 22 may coat substantially the entire surface of the head simulation phantom 2. The spacer 22 is constructed with a material such as acrylic resin, Teflon (registered trademark), foamed styrol or wood which has a low dielectric constant close to that of the air, thus minimizing a disturbance in the distribution of the electromagnetic field which may occur by the presence of the spacer 22.

Figure 11:
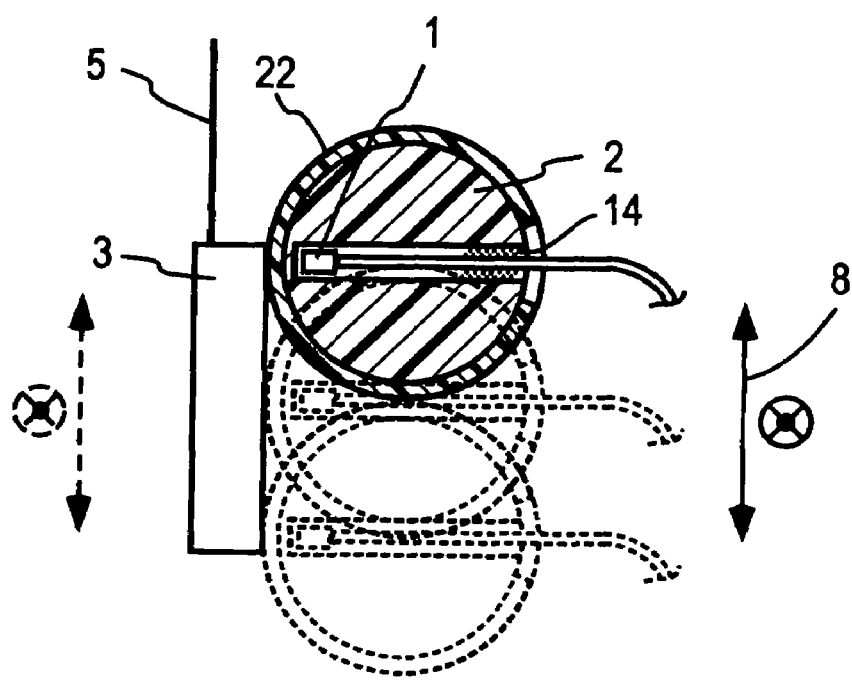
FIG. 11 illustrates that the portion of the phantom which is covered by the spacer is maintained in contact with the radio transmitter while it is subject to a moving scan, permitting a constant distance to be maintained between the phantom and the radio transmitter.

With this construction, a relative movement can take place either vertically or back-and forth, as viewed in FIG. 11, between the phantom 2 and the radio transmitter 3 for purpose of scan while maintaining the head simulation phantom 2 and the radio transmitter 3 in contact with each other, thus maintaining a constant spacing therebetween and improving the reproducibility of the measurement of absorbed power. If the radio transmitter 3 is formed with a projection, which is appended thereto, the head simulation phantom 2 can not be damaged by the projection during the scan which takes place in contact therewith, thus preventing any damage of a sensor of the electromagnetic field probe 1 from occurring. When the spacer 22 is formed around the entire surface of the phantom 2, as shown in FIG. 10, the spacer 22 is effective to protect the phantom 2 from mechanical damage.

Figures 12A, 12B, 12C:
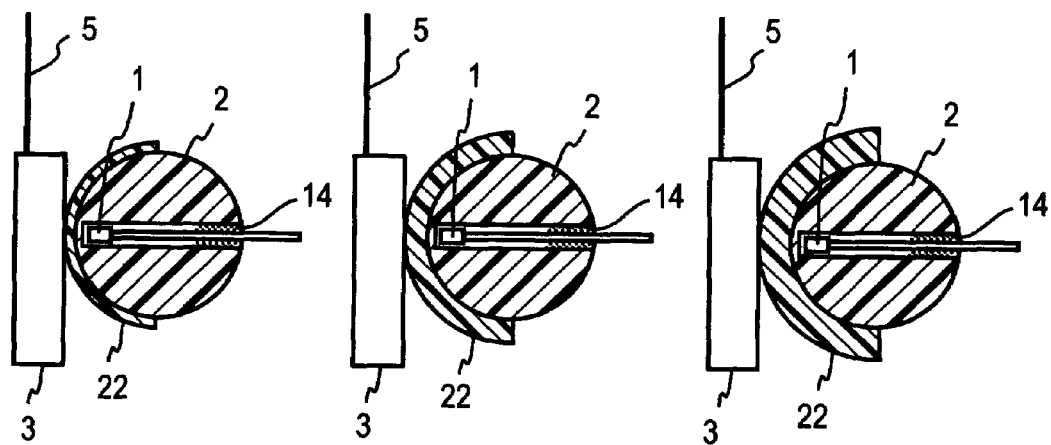
FIG. 12 illustrates the use of detachable spacers having different thicknesses in order to change the distance between the head simulation phantom and the radio transmitter, FIG. 12A being a cross section for a small spacing, FIG. 12B a cross section for an intermediate spacing and FIG. 12C a cross section for a greater spacing.

The thickness of the spacer 22 simulates the thickness of the ear of the human body or simulates the thickness of a cover applied to the radio transmitter 3, serving the both simulations. Accordingly, it is desirable that the spacer 22 has a thickness which is on the order of 20 mm at maximum and on the order of 1 mm at minimum, and by changing the thickness of the spacer 22, a variety of simulations can take place. By way of example, as shown in FIG. 12, a plurality of semi-spherical spacers 22 having mutually different thicknesses may be provided, and are mounted on the phantom 2 in a detachable manner. FIGS. 12A, 12B and 12C illustrate that sequentially thicker spacers 22 are mounted in an interchangeable manner.

Figure 13:
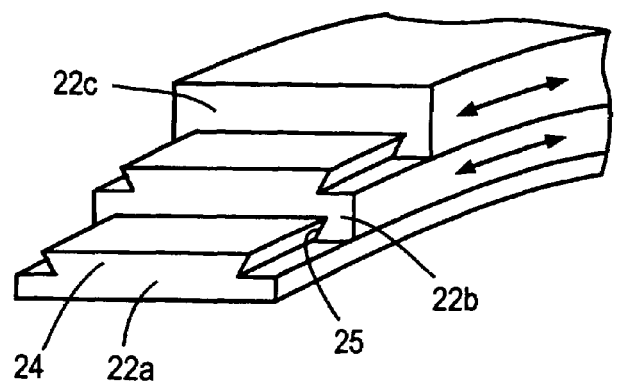
FIG. 13 is a perspective view of part of an exemplary spacer having a variable thickness.

By way of example, as shown in FIG. 13, three spacers 22a, 22b and 22c are stacked one above another and are coupled together in a slidable manner. Such coupling is achieved by removing both lateral edges of the spacer 22a which are located toward the spacer 22b along the length thereof to define a wedge-shaped coupler 24 while the surface of the spacer 22b which is disposed toward the spacer 22a is formed with a coupling recess 25 in which the wedge-shaped coupler 24 is received in the manner of a wedge, thus allowing the spacers 22a and 22b to slide relative to each other along their length while securing them together in the direction of the thickness. A similar wedge-shaped coupling takes place between the spacers 22b and 22c to couple them in a slidable manner in the direction of the length while securing them together in the direction of the thickness.

Figure 14:
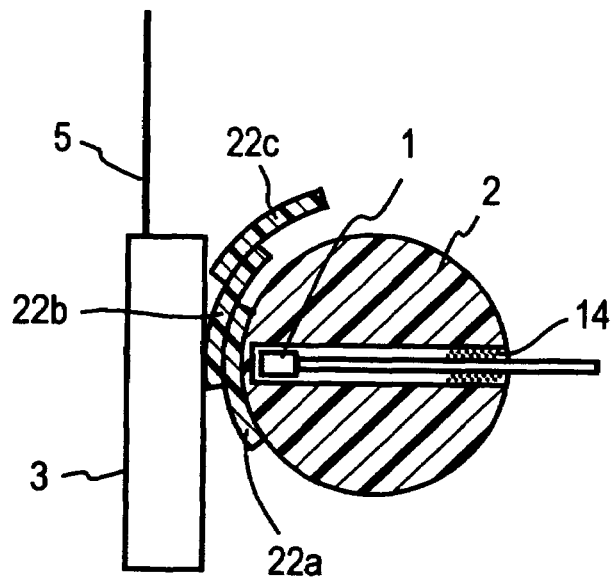
FIG. 14 illustrates the use of the spacer shown in FIG. 13, allowing the distance between the head simulation phantom and the radio transmitter to be changed.

As shown in FIG. 14, these spacers 22a, 22b and 22c which are stacked one above another are mounted on the phantom 2 so as to be interposed between the phantom 2 and the radio transmitter 3. With this arrangement, by sliding the spacers, it is possible to interpose only the spacer 22a between the phantom 2 and the radio transmitter 3, to interpose both spacers 22a and 22b as shown in FIG. 14 or to interpose the spacers 22a, 22b and 22c. In this manner, the thickness of the spacer 22 which is interposed between the phantom 2 and the radio transmitter 3 can be changed. The number of stacked spacer 22 is not limited to three, but may be suitably increased or decreased, and the individual thickness of the stacked spacers 22a, 22b and 22c can be chosen to be different from each other.

Figure 15A:
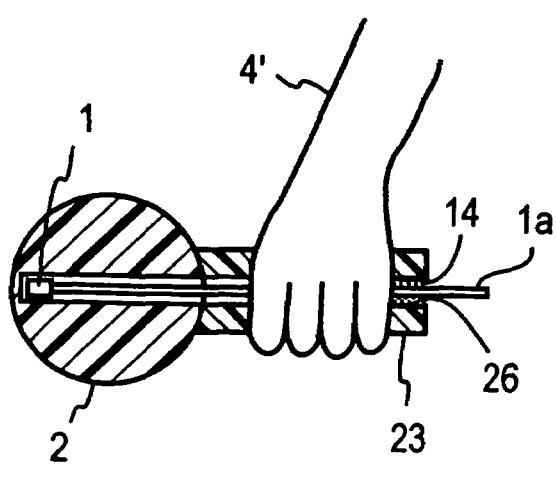
FIG. 15A shows another example of a phantom with a handle gripped by a measuring personnel.
Figure 15B:
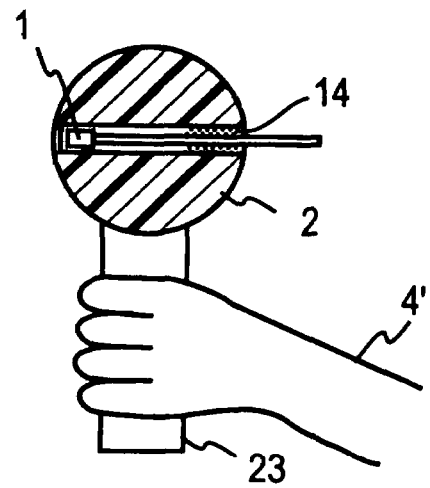
FIG. 15B shows a further example of a phantom with a handle which is gripped by a measuring personnel.

As shown in FIG. 15A, a handle 23 is secured, for example, adhesively, to the open end of a probe insertion opening 21 in the phantom 2 and extends in the direction opposite from the probe insertion opening 21 to make the radio wave which is radiated from the radio transmitter 3 to be free from the influence of the hand 4' as the hand 4' is moved away from the radio transmitter 3 when the hand 4' of a measuring personnel is brought close to the handle 23 for purpose of scan and measurement as illustrated in FIG. 8, for example. The handle 23 is formed of a material having a low dielectric constant such as acrylic resin, fluorine containing resin, foamed styrol resin or wood. The lead wire 1a of the electromagnetic field probe 1 is passed through an opening 26 which is formed inside the handle 23 in communication with the probe insertion opening 21. In this instance, an adhesive 14 is filled into the opening 26 to secure the probe 1 to the phantom 2. As shown in FIG. 15B, the handle 23 may be mounted on the phantom 2 so as to extend in a direction perpendicular to the direction in which the probe insertion opening 21 extends.

Figure 16A:
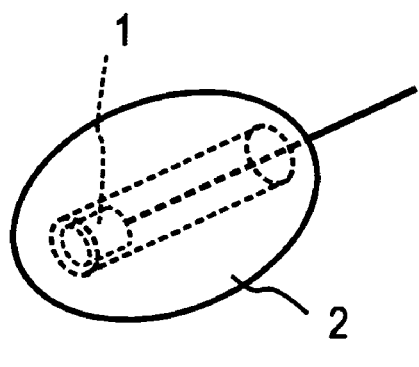
FIG. 16A shows a simulation phantom formed by an ellipsoid.
Figure 16B:
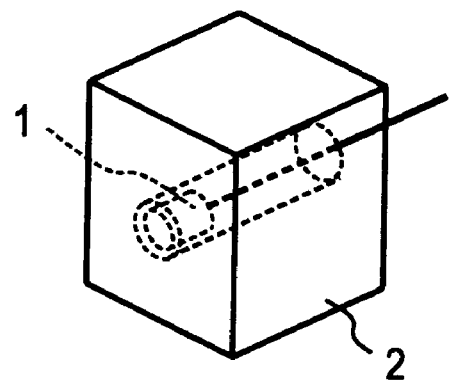
FIG. 16B shows a simulation phantom formed by a regular cube.
Figure 16C:
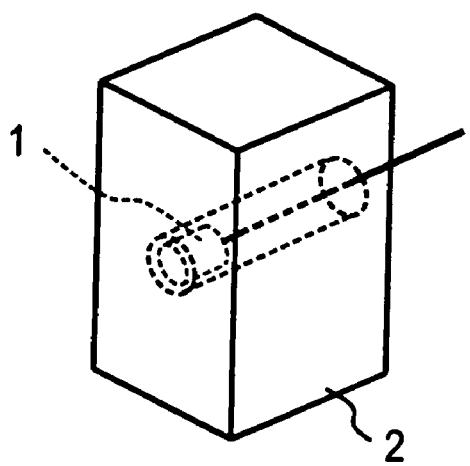
FIG. 16C shows a simulation phantom formed by a rectangular body.
Figure 16D:
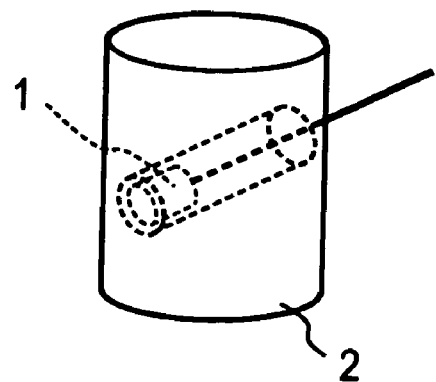
FIG. 16D shows a simulation phantom formed by a solid cylinder.

The configuration of the head simulation phantom 2 is not limited to the sphere mentioned above, but may assume a geometrically simple configuration such as an ellipsoid as shown in FIG. 16A, a cube as shown in FIG. 16B, a rectangular body as shown in FIG. 16C or a solid cylinder as shown in FIG. 16D as long as the purpose of simulating the head of the human body is served. In any event, it has a volume which is on the order of ⅛ times the volume of the head of a normal man or less, namely, $5 \times 10^5$ mm³. Rather than being limited to a phantom which simulates the head of the human body, a simulation phantom having a configuration as illustrated in FIGS. 16A to D may be constructed to simulate part of the human body such as the arm or trunk. In any event, it has a volume which is equal to or less than ⅛ times the normal volume of part of the human body being simulated.

By constructing the phantom as a sphere or a geometrically simple configuration as illustrated in FIGS. 16A to D, a distribution of the electromagnetic field within the phantom 2 which is not formed with a probe insertion opening 21 may be analytically obtained using the radio transmitter 3 as a dipole antenna, and a calibration factor for the electromagnetic field probe 1 can be determined on the basis of such analytical results.

Figure 17A:
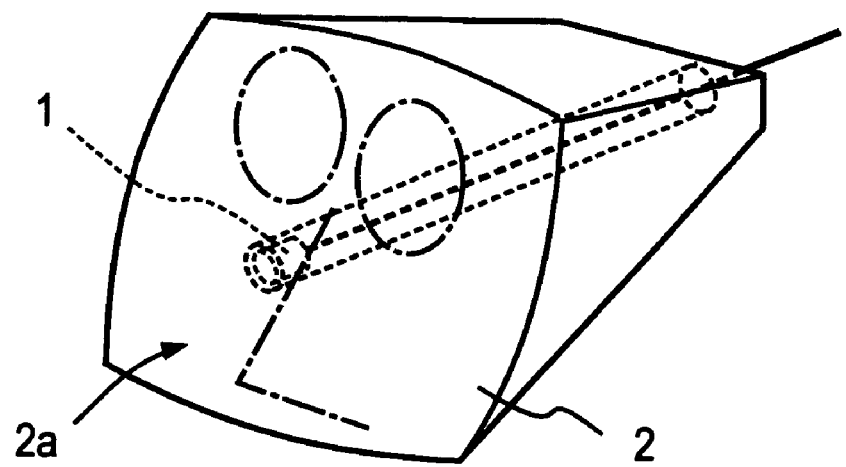
FIG. 17A is a perspective view of a head simulation phantom which relatively closely simulates the configuration of a head and having a measuring plane which corresponds to the front of a face.
Figure 17B:
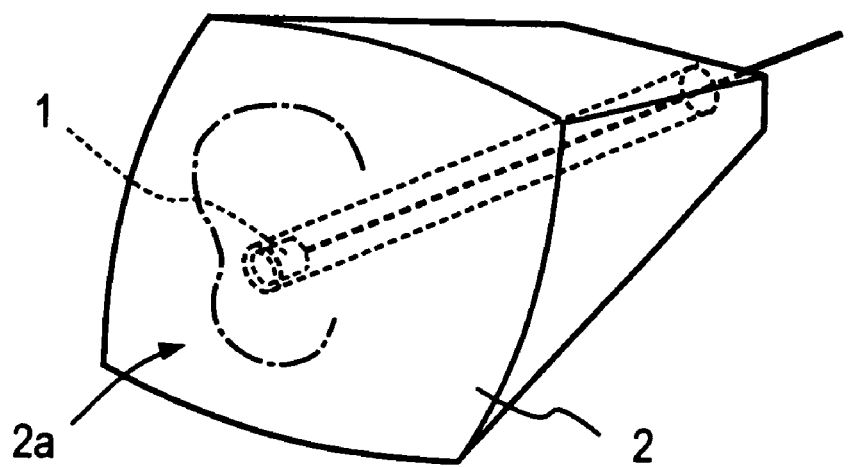
FIG. 17B is a perspective view of a head simulation phantom which relatively closely simulates the configuration of a head and having a measuring plane which corresponds to the side of a face.

By constructing a phantom 2 which simulates the configuration of the head of the human body, or simulating the front face of the head by a square-shaped plane 2a as a front surface as shown in FIG. 17A, forming a probe insertion opening 21 so that it extends from the rear side to a point close to the front surface 2A and inserting an electromagnetic field probe 1 therein, an absorbed power measuring assembly 7 which can be used with a transceiver as the radio transmitter 3 may be constructed. Eyes and nose indicated by single dot chain lines may assume configurations which correspond to actual eyes and nose, or may be a simple plane with dot indications thereon which represents the front face for the sake of convenience. Alternatively, as shown in FIG. 17B, the square-shaped plane 2a may be provided as a front surface which simulates the lateral side of the face of the head and an electromagnetic field probe 1 may be inserted therein to construct an absorbed power measuring assembly 7 which can be used when utilizing a mobile telephone as the radio transmitter 3. The ear indicated by single dot chain lines may be configured so as to correspond to the actual ear, or may be a simple plane with a dot indication representing the lateral side of the face for the sake of convenience. When the configuration is relatively complex as in such a phantom, a distribution of the electromagnetic field cannot be analytically obtained to determine a calibration factor for the electromagnetic field probe 1, but the finite-difference time-domain method may be used to derive a distribution of the electromagnetic field numerically, and a calibration factor for the electromagnetic field probe 1 can be determined therefrom.

While the above description has principally dealt with phantom 2 of a type in which the liquid medium 10 is confined into the enclosed vessel 11 as shown in FIG. 7B may be used as phantoms which are used in the embodiments shown in FIGS. 9 to 17. In this instance, since the liquid medium 10 is sealed, an aging effect in the electromagnetic characteristics which may result from the evaporation of components can be prevented while facilitating the handling.

Second Invention

FIG. 18 shows an embodiment of another aspect of the invention, and parts corresponding to those shown in FIGS. 1 to 17 are designated by like reference characters as used before.

A phantom 2 which simulates the electromagnetic characteristics of the human body is provided. In this instance, there is no need to simulate the configuration of part of the human body. FIG. 18 represents an arrangement in which the phantom 2 is formed with the solid dielectric 10' in the form of a relatively flat cube. A probe insertion opening 21 is formed into one surface of the phantom 2 and extends close to the opposite surface 2a. An electromagnetic field probe 1 is inserted into and secured in the inner end of the probe insertion opening 21, thus constructing an absorbed power measuring assembly 7. Securing the electromagnetic field probe 1 may take place, for example, by way of the adhesive 14 as illustrated in FIG. 7A.

A radio transmitter 3 is disposed in proximity to the location of the electromagnetic field probe 1 within the phantom 2, and a scan takes place by a scan mechanism 100 while the radio transmitter 3 is disposed opposite to the phantom 2. In the example shown in FIG. 18, the radio transmitter 3 is disposed close to and in parallel relationship with the surface 2a of the phantom 2 which is located close to the probe 1 while an antenna 5 of the radio transmitter 3 such as a mobile telephone extracts from a casing 3a. The radio transmitter 3 is mounted so that the casing 3a is held gripped by a retainer 4.

The scan mechanism 100 may comprise drive screws 121, 122 extending along a pair of parallel sides of a rectangular frame-shaped base 110, for example, and rotatably mounted by four supports 111. Similarly, drive screws 123, 124 are rotatably mounted by the supports 111 on the other pair of parallel sides. A support bar 131 which extends parallel to the drive screws 121, 122 is formed with threaded holes at its opposite ends, which are threadably engaged with the drive screws 121, 122. Also, a support bar 132 which extends parallel to the drive screws 123, 124 is formed with threaded holes at its opposite ends, which are threadably engaged with the drive screws 123, 124. The support bars 131 and 132 are slightly offset from each other in a direction perpendicular to the surface of the phantom 2 which is disposed opposite to the radio transmitter.

Figure 18A:
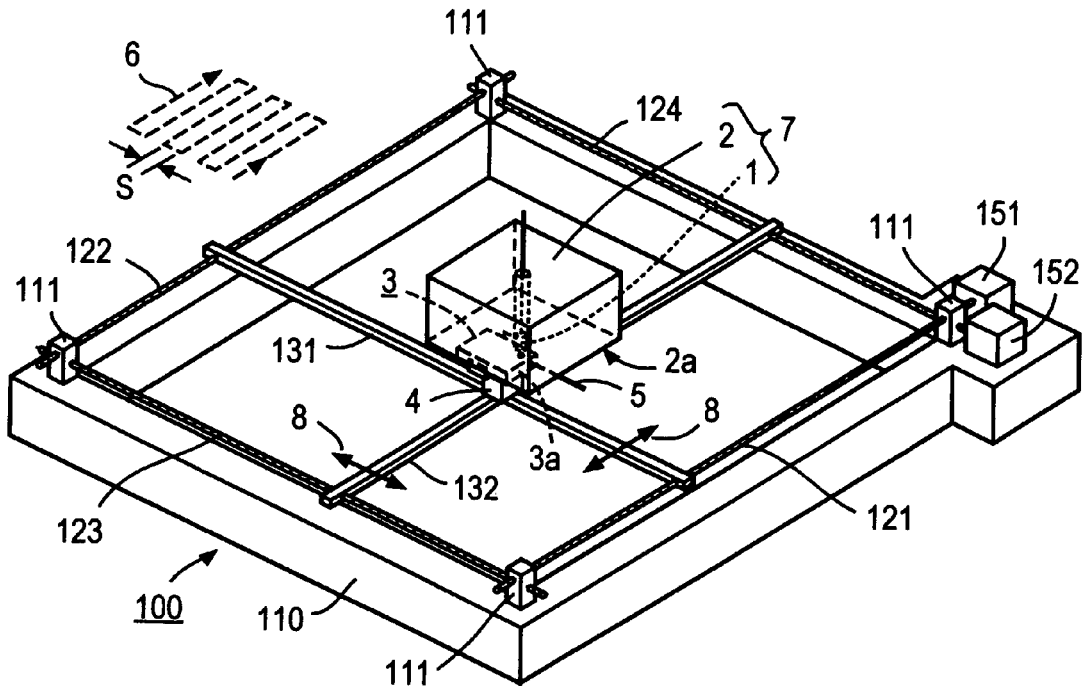
FIG. 18A is a perspective view of an embodiment of the second invention.
Figure 18B:
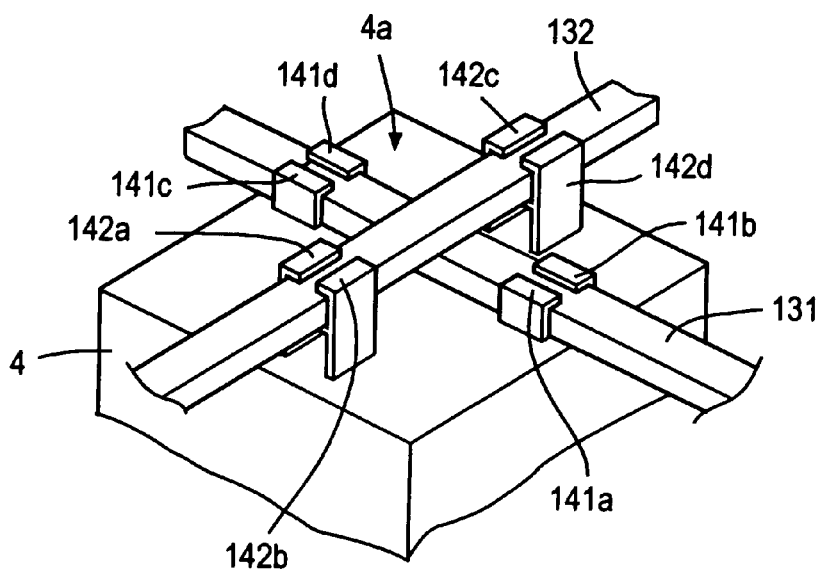
FIG. 18B is a perspective view showing an exemplary engagement retaining mechanism for maintaining a slidable relationship between a drive bar and a retainer with the bottom surface of a retainer 4 shown in FIG. 18A disposed upside.

As shown in FIG. 18B, pairs of opposing, inverted L-shaped engaging peaces 141a and 141b, 141c and 141d, 142a and 142b, and 142c and 142d are fixedly mounted on the surface 4a of the retainer 4 which is disposed opposite from the phantom 2, and the support bar 131 passes between the pairs of engaging pieces 141a and 141b and 141c and 141d so as to be slidable between the ends of these engaging pieces and the surface 4a of the retainer 4. In the similar manner, the support bar 132 is passed between the pairs of engaging pieces 142a and 142b and 142c and 142d so as to be slidable. However, it is to be noted that the support bar 132 has its opposite lateral edges received in grooves formed in the ends of the engaging pieces 142a-142d, whereby its movement in a direction perpendicular to the surface 4a of the retainer is restricted.

An arrangement is made such that the drive screws 121, 122 can be driven for rotation in forward and reverse directions by a controller 151 including a motor for example, and the drive screws 123, 124 can be driven for rotation in forward and reverse directions by a similar controller 152. An absorbed power measuring assembly 7 is mounted on a support 160 which is secured to the base 110 so that the surface 2a of the phantom 2 is disposed close to and opposite to the radio transmitter 3 which is retained by the retainer 4.

Figure 19:
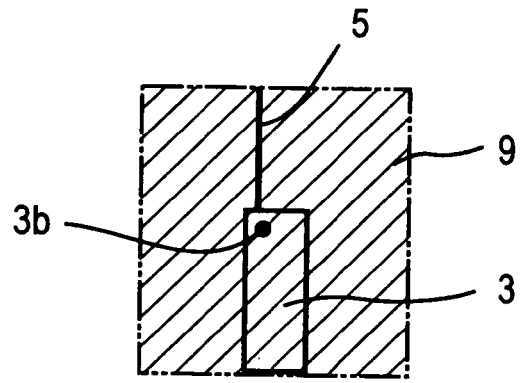
FIG. 19 illustrates an example of a range of measurement obtained when the absorbed power measuring assembly 7 undergoes a two-dimensional scan in the arrangement of FIG. 18A.

Accordingly, when the drive screws 121, 122 rotate, the support bar 131 moves along the screws 121, 122 depending on the direction of rotation thereof, whereby the radio transmitter 3 also moves in the same direction. When the drive screws 123, 124 rotate, the support bar 132 moves along the screws 123, 124 depending on the direction of rotation thereof, whereby the radio transmitter 3 also moves in the same direction. Thus, by controlling the controllers 151, 152, a two-dimensional scan of the probe 1 relative to the radio transmitter 3 can take place, as indicated by a locus 6 which is shown offset in this Figure. For example, the two-dimensional scan is capable of measuring the power absorbed from the radio wave over the entire surface 2a of the phantom 2 while the antenna feed point 3b of the radio transmitter 3 is disposed opposite to the probe 1. FIG. 19 illustrates by way of example that an area 9, shown hatched, over the surface 2a of the phantom 2 can be measured relative to the radio transmitter 3. It is to be noted that what is measured by the electromagnetic field probe 1 is values on the locus of scan 6, and values in interstices S between adjacent scan lines are interpolated from adjacent measured values. In order to reduce the time of measurement, rather than using a continuous measurement, the measurement takes place at an interval on the scan line, and values in the interval are interpolated from adjacent measured values. The spacing between the adjacent scan lines may be chosen on the order of 1 cm, for example. The range of measurement (area) 9 is preferably a rectangular range which is determined by the longitudinal length (inclusive of the antenna length) and the lateral length of the radio transmitter 3.

Figure 20:
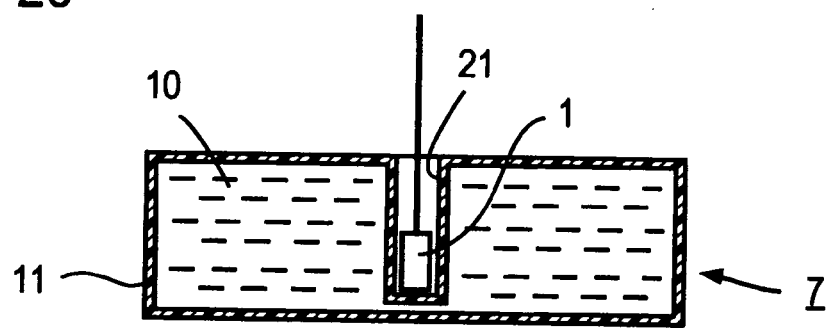
FIG. 20 is a cross section showing an example of an absorbed power measuring assembly 7 which uses a liquid medium 10.

The phantom 2 used may comprise an enclosed vessel 11 which is configured in the similar manner as shown in FIG. 18A and which is formed with a probe insertion opening 21, into which a liquid medium 10 is filled, as shown in FIG. 20.

The scan mechanism 100 allows a two-dimensional scan of the absorbed power measuring assembly 7 relative to the radio transmitter, and accordingly, the power absorbed from the radio wave by each part of the human body which corresponds to the phantom 2, can be measured with a high positional accuracy. In addition, a result which is similar to a result of measurement according to the measuring technique shown in FIG. 1 in which the probe 1 is moved for purpose of scan is obtained and the likelihood that the response of the liquid medium 10 may be changed due to the evaporation is avoided with the phantom 2 which uses the liquid medium 10. The scan mechanism 100 is not limited to the example described above, but a variety of X·Y drive mechanism may be used.

Figure 21:
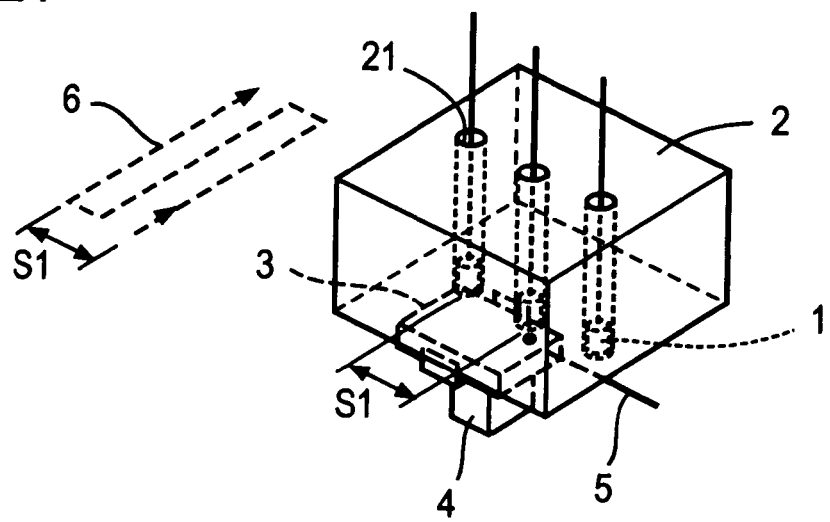
FIG. 21 is a perspective view of an exemplary absorbed power measuring assembly in which a plurality of electromagnetic field probes are fixedly mounted as a linear array within the phantom.

As shown in FIG. 21, a plurality of electromagnetic field probes 1 are fixedly mounted in a linear array within a phantom 2. A moving scan of a radio transmitter 3 obtains a range of measurement shown in FIG. 19 with a stroke corresponding to a spacing S1 between the electromagnetic field probes 1 in the direction of the array of the electromagnetic field probes 1. In FIG. 21, the probes 1 are arrayed in a direction parallel to the lengthwise direction of the radio transmitter 3, but may be arrayed in a direction perpendicular to the lengthwise direction.

Figure 22:
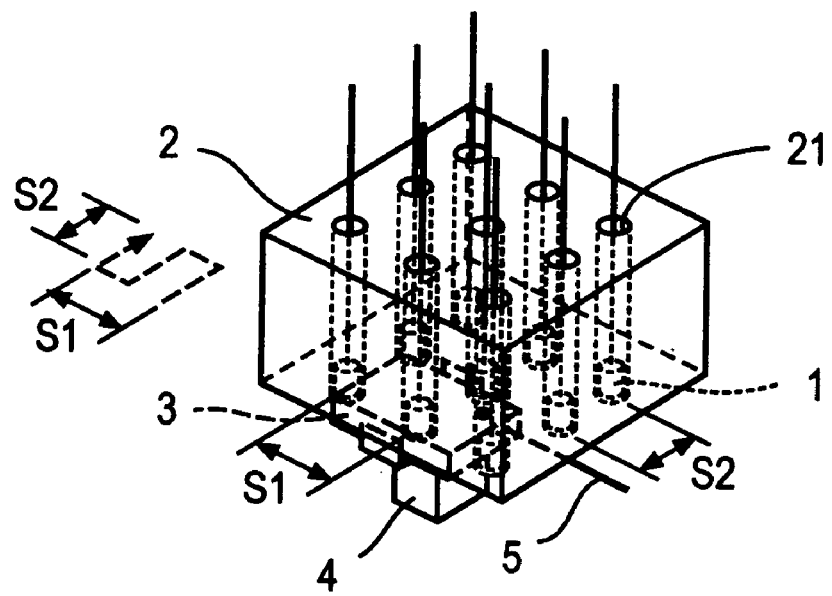
FIG. 22 is a perspective view of another absorbed power measuring assembly in which a plurality of electromagnetic field probes are fixedly mounted as a matrix inside the phantom.

As shown in FIG. 22, a plurality of electromagnetic field probes 1 may be arrayed in a matrix in a plane which is close to the surface 2a of a phantom 2. In this instance, a measurement over the range shown in FIG. 19 can be obtained by scanning in one direction of the array of the electromagnetic probes 1 through a stroke corresponding to a spacing S1 and scanning in the other direction of the array through a stroke corresponding to a spacing S2. Again, a value or values located between measuring points are interpolated from adjacent measured values. In consideration of these, the number of probes 1 which are disposed within the phantom 2 is contemplated to be from 1 to the order of 10, and the spacing between the probes are preferably S1=S2=20 mm or so.

With the arrangement shown in FIG. 21, the scan stroke is shorter than in the example shown in FIG. 18, and the measurement can be completed in a shorter time interval and a scan mechanism 100 can be constructed in a compact form. With the embodiment shown in FIG. 22, the time interval of measurement can be made shorter and the scan mechanism can be constructed in a smaller size.

Figure 23:
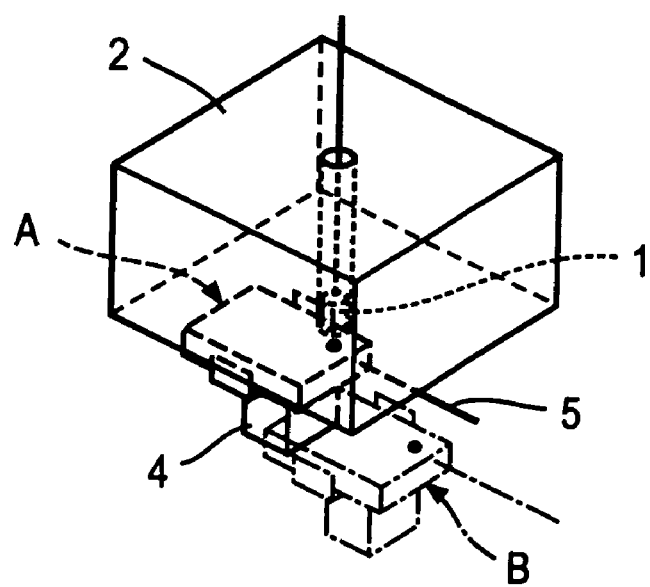
FIG. 23 is a perspective view illustrating the situation that the radiation of a radio wave from a radio transmitter is influenced, not only by the phantom, but also by aerial condition during the scan.

As indicated in FIG. 23, when a radio transmitter 3 is brought to a position A during a moving scan or when the majority of the radio transmitter 3 is located opposite to a phantom 2, the radiation characteristics of the radio transmitter 3 is strongly influenced by the phantom 2, but at position B or when a significant portion of the radio transmitter 3 is not disposed opposite to the phantom 2 or misaligned therewith, the radiation characteristics of the radio transmitter 3 is influenced by both the phantom 2 and the air.

Figure 24:
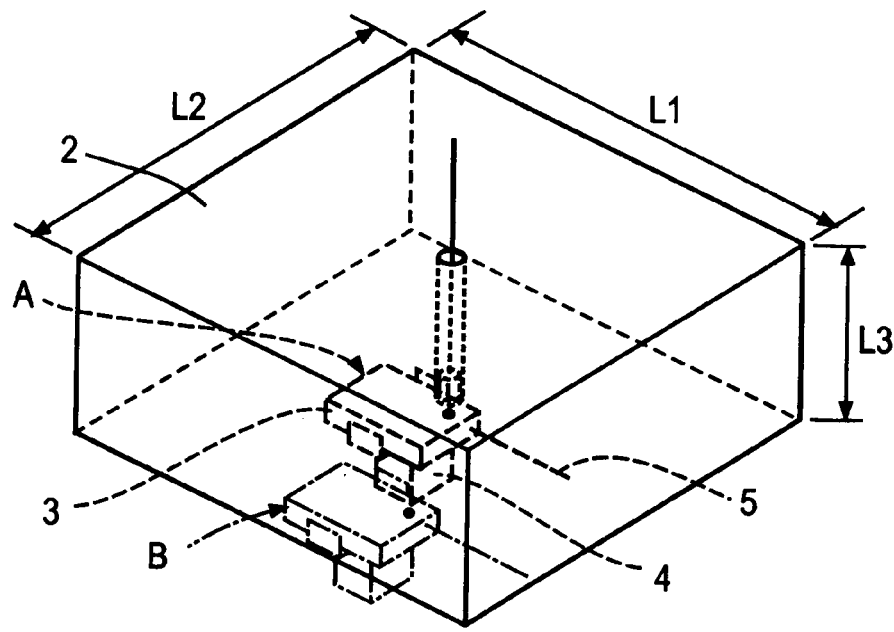
FIG. 24 is a perspective view of an example of a phantom in the form of a flat plate which can be regarded as having an infinity size as far as a radio transmitter is concerned.

In consideration of this, as illustrated in FIG. 24, the configuration of a phantom 2 may be chosen to be in the form of a flat plate having an infinity size as seen by a radio transmitter 3, with the radio transmitter 3 disposed opposite to a central portion of one surface of the plate-shaped phantom 2. In this manner, the influence of the phantom upon the radiation characteristics of the radio transmitter 3 can be made substantially uniform at any position of the radio transmitter 3 during its moving scan. When part of the human body which is located close to the radio transmitter 3 is more planar and its area is greater, the absorption of the radio wave occurs more strongly. Accordingly, when an absorbed power measuring apparatus is constructed in the manner shown in FIG. 24, a maximum value evaluation can be made. In order for the phantom 2 to be viewed by the radio transmitter 3 as having an infinity size, its length L1 as measured in the direction in which an antenna 5 extends should be equal to or greater than $0.6\lambda$, its length L2 in a direction perpendicular to the antenna 5 should be equal to or greater than $0.5\lambda$, and its thickness L3 should be equal to or greater than $0.3\lambda$ where $\lambda$ represents the wavelength of a radio wave transmitted from the radio transmitter 3.

The phantom 2 may be one which simulates respective part of an actual human body as illustrated in FIGS. 7, 16 and 17 or one which employs an geometrically simple configuration. However, it is not necessary that the volume of the phantom 2 be equal to the volume of a corresponding part of the human body. In any event, the measurement takes place by a moving scan of the absorbed power measuring assembly 7 and the radio line transmitter 3 relative to each other using the scan mechanism 100 shown in FIG. 18 or the like, for example.

Figure 25:
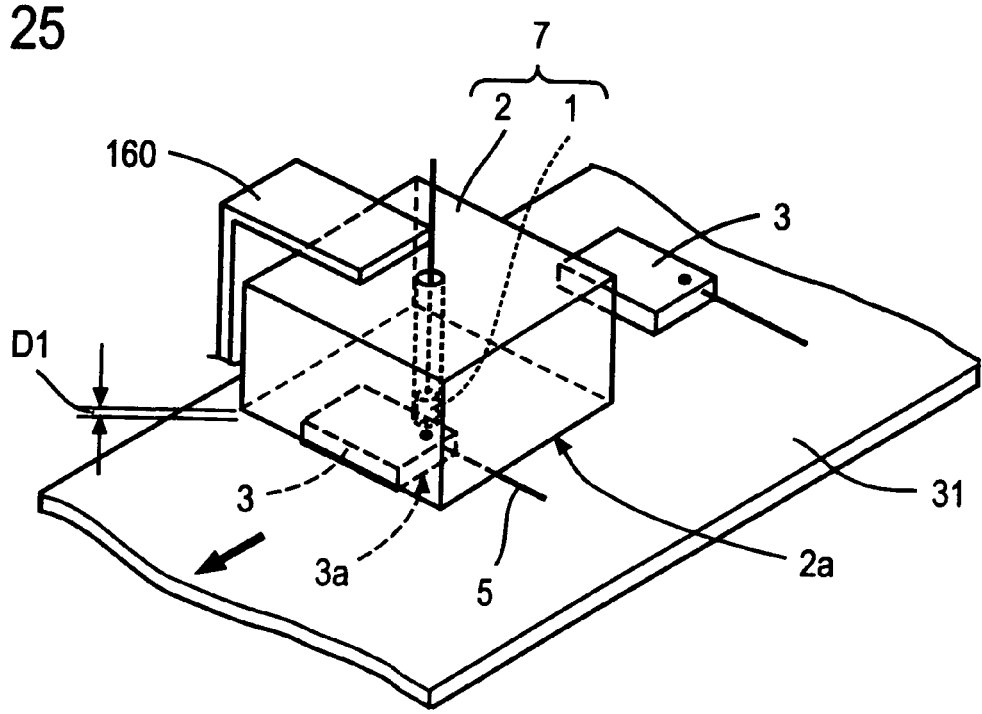
FIG. 25 is a perspective view of an example of a scan mechanism which comprises a belt conveyor.

The use of a belt conveyor in a scan mechanism 100 is illustrated in FIG. 25. A belt conveyor 31 is maintained substantially horizontal across its width and runs substantially horizontally. A drive mechanism for the belt conveyor 31 is not shown in the drawing. A phantom 2 as mounted on a support 160 is fixedly mounted over the belt conveyor 31. The surface 2a of the phantom 2 which is located close to a probe 1 is disposed opposite to the belt conveyor 31 with a spacing D1 with respect to the top surface of the belt conveyor 31. The radio transmitter 3 is placed on the belt conveyor 31 so that its lengthwise direction extends in the crosswise direction of the belt conveyor 31 and the direction of thickness of a casing 3a extends perpendicular to the top surface of the belt conveyor 31. Substantially the entire length of the radio transmitter 3 passes under the phantom 2, and the spacing D1 is chosen so that the surface 2a of the phantom 2 is disposed as close to the radio transmitter 3 as possible.

The radio transmitter 3 is placed on an upstream portion of the belt conveyor 31, and as the radio transmitter 3 passes under the phantom 2, a linear scan takes place between the radio transmitter 3 and an absorbed power measuring assembly 7, thus enabling a measurement. With this arrangement, when radio transmitters 3 are successively placed on the belt conveyor 31, a measurement of the power absorbed by the phantom 2 can be automatically made for a number of radio transmitters 3.

Figure 26:
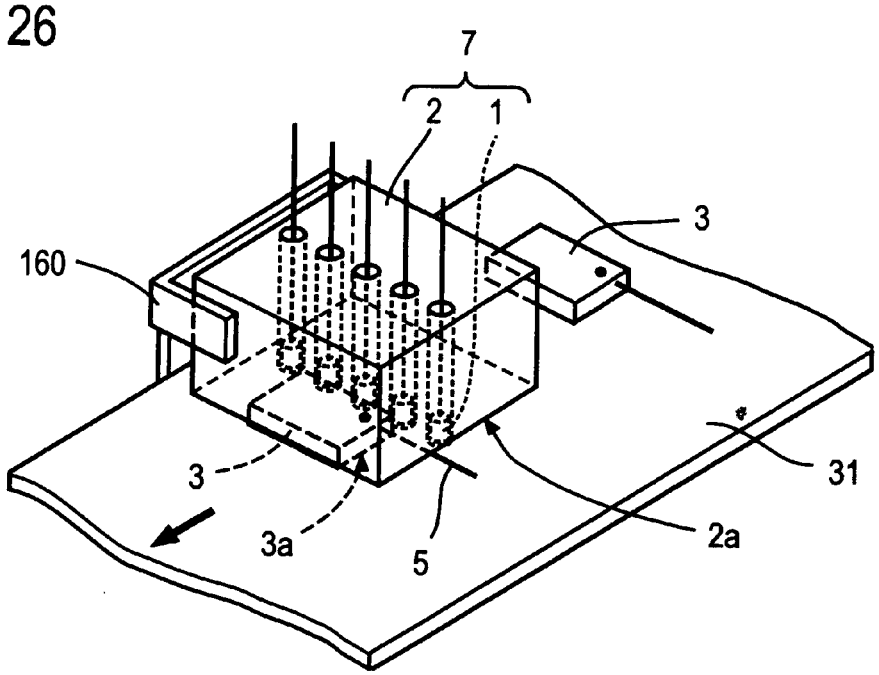
FIG. 26 is a perspective view of an example of a plurality of electromagnetic field probes disposed within the phantom and which are disposed perpendicular to the direction of movement of the belt conveyor.
Figure 27:
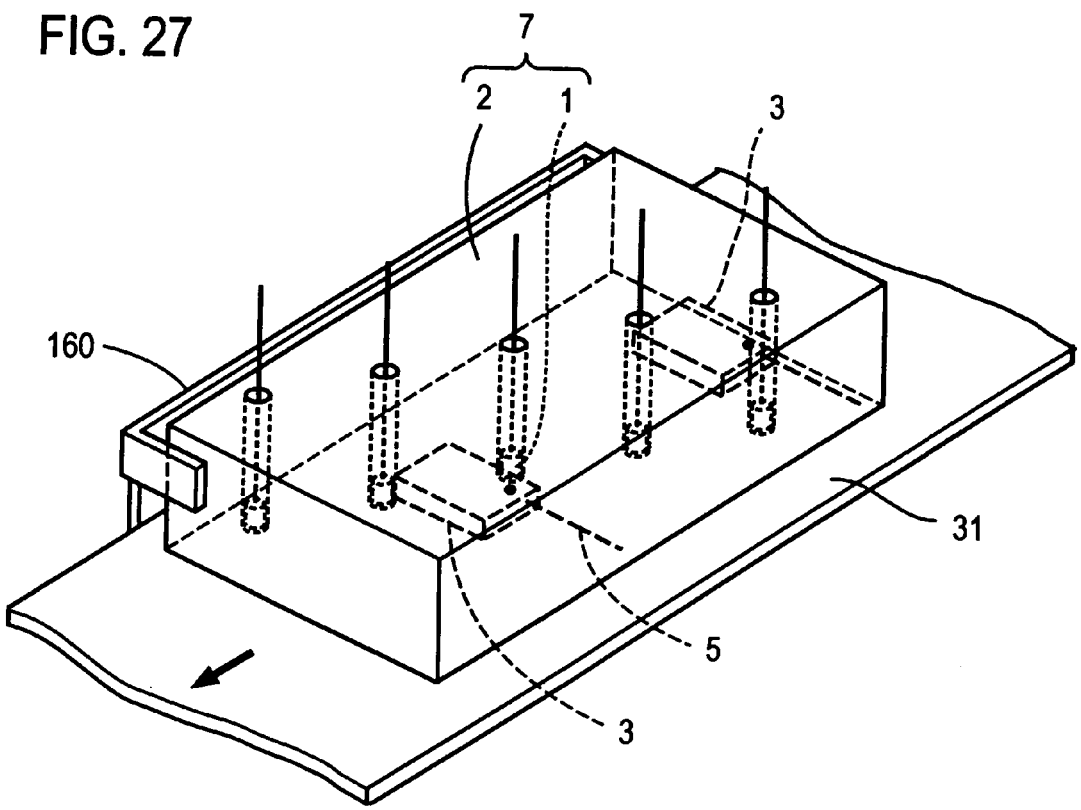
FIG. 27 is a perspective view of another example in which a plurality of electromagnetic field probes disposed within the phantom are disposed at an angle with respect to the direction of movement of the belt conveyor.

As shown in FIG. 26, when a plurality of electromagnetic field probes 1 are disposed within a phantom 2 as an array in a crosswise direction of the belt conveyor 31, merely placing a radio transmitter 3 on the belt conveyor 31 allows a range of measurement of absorbed power can be extended to a two-dimensional plane. In addition, as shown in FIG. 27, when a plurality of electromagnetic field probes 1 are disposed as an oblique array with respect to the crosswise direction of the belt conveyor 31, the electromagnetic field probes 1 can be kept far away from each other. This allows a reduction in the equivalent dielectric constant and the conductivity of the phantom 2 under the influence of the probe insertion opening 21 which is used to secure the electromagnetic field probe 1 to be alleviated. In this instance, a phantom 2 in the form of a flat plate has an infinity size as viewed from the radio transmitter 3, thus preventing the radiation characteristics of the radio transmitter 3 and the antenna reflected power from changing as long as the radio transmitter 3 is disposed opposite to the phantom 2.

Figure 28:
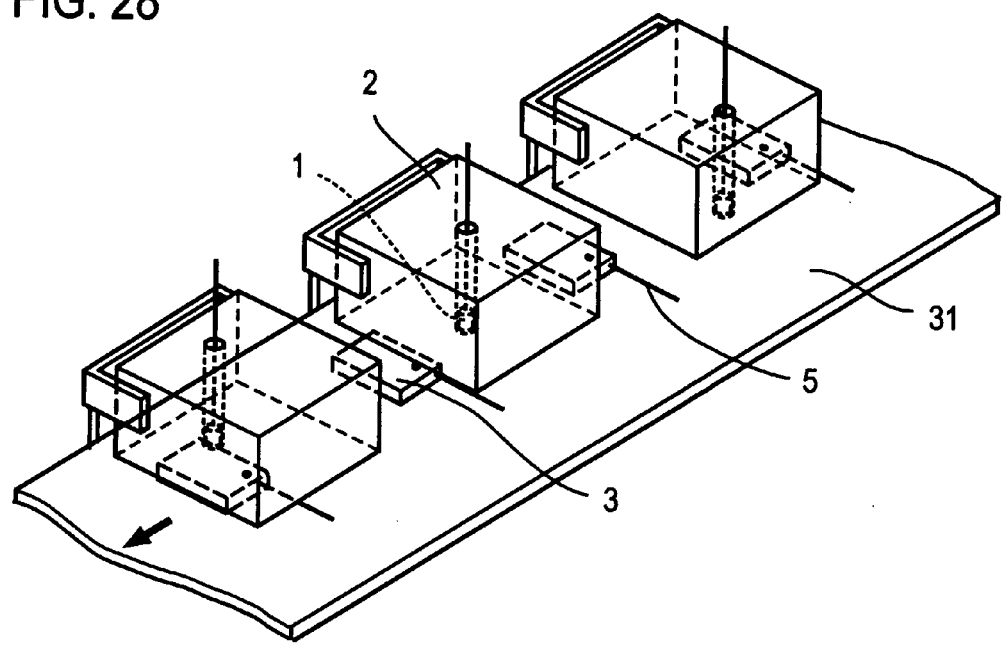
FIG. 28 is a perspective view of an example of an absorbed power measuring assembly comprising a plurality of phantoms which are formed to an equal configuration from an equal material and a plurality of electromagnetic field probes which are secured at different positions within the respective phantoms.

As shown in FIG. 28, a plurality of phantoms 2, which may be three in number, having an identical configuration and formed of an identical material are fixedly mounted as an array in a direction in which a belt conveyor 31 runs. However, an electromagnetic field probe 1 is fixedly mounted in each phantom 2 at a mutually different position as viewed in the crosswise direction of the belt conveyor 31. In this instance, the phantom 2 has a size which corresponds to a part of the human body. For example, the phantom 2 shown in FIGS. 2, 18A and 20 may be used. In this manner, measured values from the two-dimensional scan include contributions of configuration of the part of the human body while the response of each phantom 2 is little influenced by the electromagnetic field probes 1. The shift of position of the electromagnetic field probes 1 between different phantoms 2 may be chosen in the running direction rather than in the crosswise direction of the belt conveyor, or may be chosen in any other suitable manner.

Figure 29:
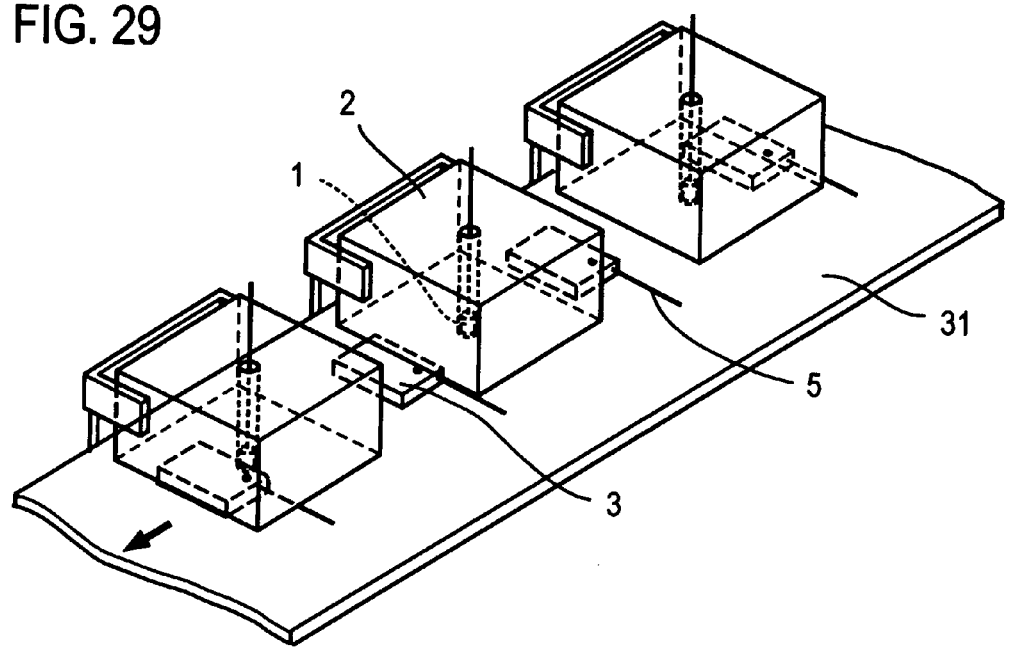
FIG. 29 is a perspective view of an example of an absorbed power measuring assembly comprising a plurality of phantoms formed to the same configuration and from the same material and a plurality of electromagnetic field probes which are secured at an identical position within the respective phantoms.

As shown in FIG. 29, a plurality of phantoms 2, which may be three in number, for example, having an identical configuration and formed with an identical material may be fixedly mounted as an array in the running direction of the belt conveyor 31, and an electromagnetic field probe 1 is mounted at the same position, for example, at the center of each phantom 2. As the belt conveyor 31 runs, each radio transmitter 3 is subject to the measurement of absorbed power by three absorbed power measuring assemblies 7 under the same condition. A mean value of a plurality of measured values for each radio transmitter 3 may be chosen to define the power absorbed from the radio wave from this radio transmitter 3, or a maximum value among a plurality of measured values for each radio transmitter 3 may be chosen to define the power absorbed from the radio wave from this radio transmitter 3. The process of determining such a mean value or a maximum value takes place in the calculation and display unit 80 shown in FIG. 7.

Figure 30:
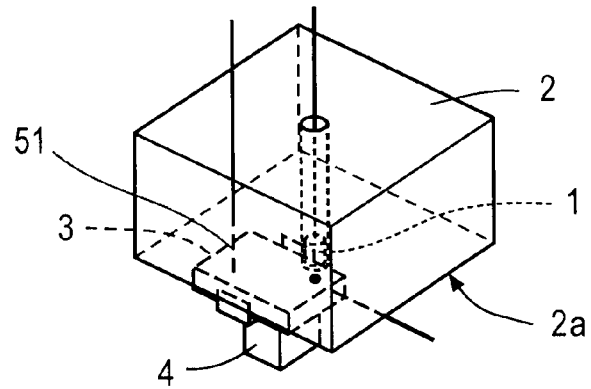
FIG. 30 is a perspective view of an example illustrating a position detecting sensor which is mounted on the phantom.

In an example shown in FIG. 30, a position sensor 51 is mounted on a phantom 2 in order to improve the accuracy of measuring position. The position sensor 51 is mounted on the phantom 2 so that its position relative to the probe 1 can be defined, thus detecting whether or not the position sensor 51 is located opposite to a radio transmitter 3. The position sensor 51 detects whether or not it is located opposite to the radio transmitter 3 by radiating an infrared pulse beam in a direction perpendicular to the surface 2a of the phantom 2, for example, and determining a time interval until a reflected infrared pulse is received or the strength of the reflected infrared pulse. As a scan mechanism performs a two-dimensional moving scan of the radio transmitter 3, each point where the radio transmitter 3 has been detected can be plotted, whereby the configuration of the radio transmitter 3 which opposes the phantom 2 is detected. Since the relative position between the probe 1 and the position sensor 51 in a plane parallel to the scan plane is fixed and is previously known, the position of each measuring point of the probe 1 with respect to the configuration of the detected radio transmitter 3 can be determined, and when the configuration of the radio transmitter 3 is determined with a high accuracy, the position of the measuring point of the probe 1 can be determined with a corresponding accuracy.

When the belt conveyor 31 shown in FIG. 25 is used as the scan mechanism, running the belt conveyor 31 at a constant speed and placing radio transmitters 3 on the belt conveyor 31 at a given time interval allows the time to be determined when a particular radio transmitter 3 reaches the position of the probe 1, by dividing the distance between the position where the radio transmitter 3 is placed on the belt conveyor 31 and the absorbed power measuring assembly 7 by the running speed of the belt conveyor 31. In this instance, if the position sensor 51 is also used in the absorbed power measuring assembly 7 as shown in FIG. 30, the measuring position of the probe 1 relative to the radio transmitter 3 can be correctly determined by detecting the arrival of the radio transmitter 3 by the position sensor 51, if the position where the radio transmitter 3 is placed on the belt conveyor 31 is misaligned or the time interval to place it is offset.

Figure 31:
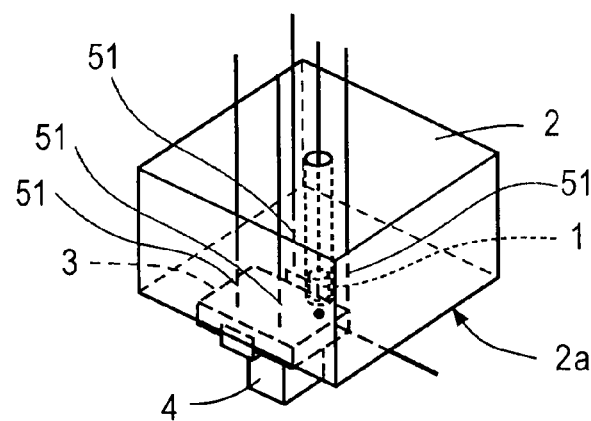
FIG. 31 is a perspective view of an example in which a plurality of position detecting sensors are mounted on the phantom in a manner to surround the electromagnetic field probe.

As shown in FIG. 31, by disposing the position sensors 51 so as to surround the probe 1, the positional relationship between the radio transmitter 3 and the probe 1 can be determined with a better accuracy.

Figure 32:
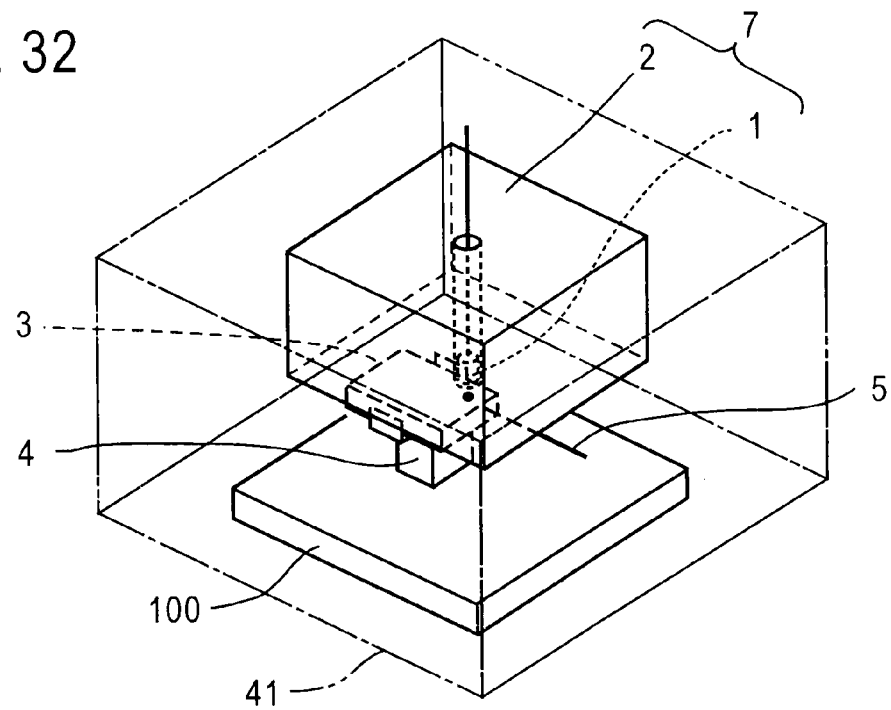
FIG. 32 is a perspective view of a radio anechoic box in which an absorbed power measuring assembly and a scan mechanism are entirely confined.

FIG. 32 shows an exemplary construction in which an absorbed power measuring assembly 7 and a scan mechanism 100 are enclosed in a radio anechoic box 41. With this construction, it is possible to prevent an electromagnetic field probe 1 from detecting undesired radio waves and to prevent a leakage of the radio wave radiated by a radio transmitter 3 to the exterior.

Figure 33:
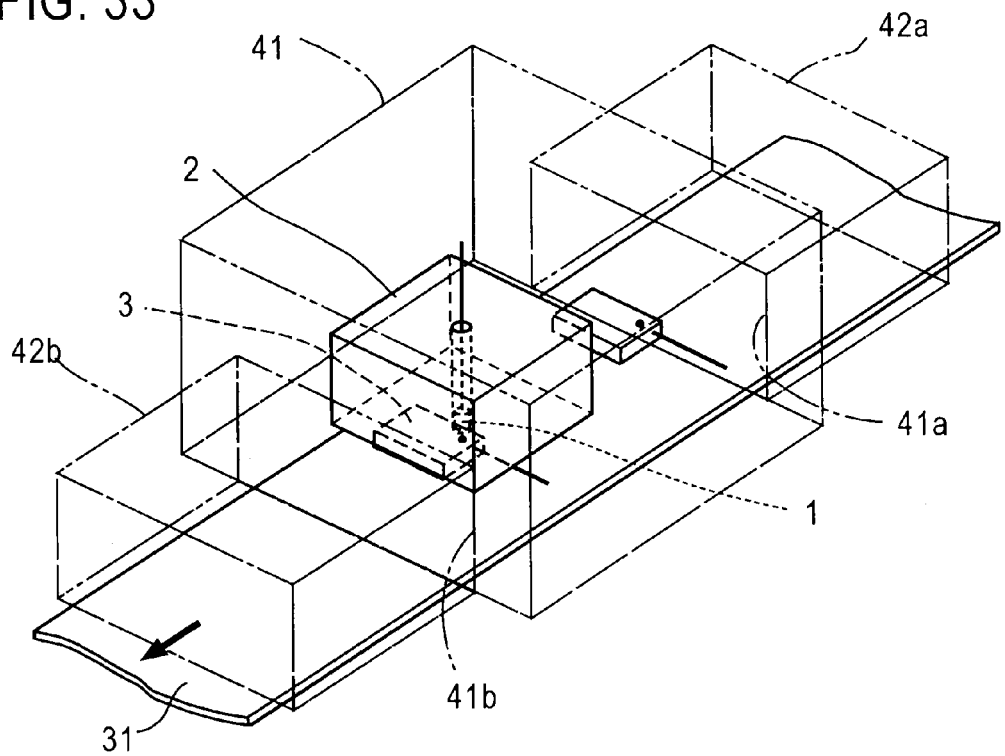
FIG. 33 is a perspective view of an example of a radio anechoic box in which an absorbed power measuring assembly is confined and through which a belt conveyor passes.
Figure 34:
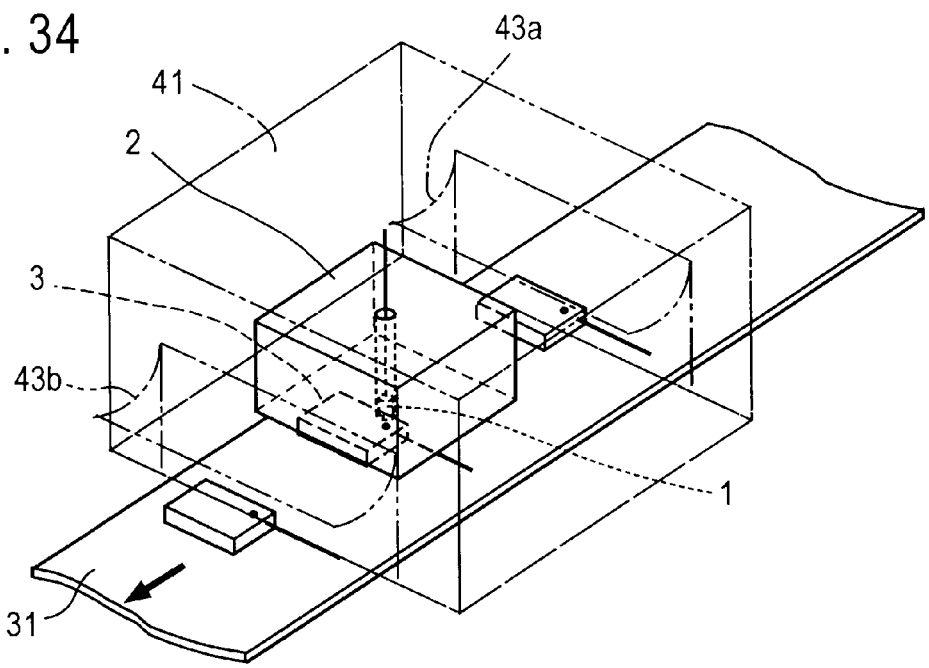
FIG. 34 is a perspective view of a modification of FIG. 33.

When the scan mechanism is constructed with the belt conveyor 31, a pair of opposing walls of the radio anechoic box 41 are formed with openings 41a, 41b in opposing relationship so as to pass the belt conveyor 31 therethrough, and metal tubes 42a, 42b are mounted to connect with the openings 41a, 41b, as shown in FIG. 33. The openings of the tubes 42a, 42b are chosen so that their cut-off frequency is higher than the frequency of the radio wave radiated from the radio transmitter 3 within the radio anechoic box 41, thus preventing the radio wave from the radio transmitter 3 from passing through the tubes 42a, 42b. Alternatively, cloths 43a, 43b woven with metal are attached to the upper edges of the openings 41a, 41b of the radio anechoic box 41 to hang therefrom, as shown in FIG. 34, thus causing the cloths 43a, 43b to be forced out of the way by the radio transmitter 3 as it passes through the openings 41a, 41b.

A phantom using the liquid medium 10 as well as the solid dielectric 10' may be used also in the embodiments shown in FIGS. 21 to 34. It is also desirable according to the second invention that the probe 1 be disposed within 20 mm from the surface 2a of the phantom which faces the radio transmitter 3.

What is claimed is:

1. An apparatus for measuring absorbed power comprising:
an electromagnetic field probe disposed within a phantom which simulates the electromagnetic characteristics of a human body, and wherein the strength of an electric field or a magnetic field of a radio wave externally irradiated upon the phantom is measured by the electromagnetic field probe, and the power of the radio wave absorbed by the human body is estimated on the basis of measured values; and
a scan mechanism which causes a relative movement between the phantom and a radio transmitter, wherein
the scan mechanism comprises a belt conveyor, and
the phantom is fixedly mounted in opposing relationship with the belt conveyor while the radio transmitter acting as a radiation source of the irradiating radio wave is placed on a surface of the belt conveyor which faces the phantom.

2. The apparatus for measuring absorbed power according to claim 1 in which a plurality of electromagnetic field probes are disposed within the phantom.

3. The apparatus for measuring absorbed power according to claim 1 in which the phantom is in the form of a flat plate and has a size larger than the size of the radio transmitter acting as a radiation source of the irradiating radio wave.

4. The apparatus for measuring absorbed power according to claim 1 in which a plurality of electromagnetic field probes are disposed as an array in the crosswise direction of the belt conveyor.

5. The apparatus for measuring absorbed power according to claim 1 in which the phantom is in the form of a flat plate having a size larger than the size of the radio transmitter, and a plurality of electromagnetic field probes are disposed as an oblique array relative to the crosswise direction of the belt conveyor.

6. The apparatus for measuring absorbed power according to claim 1 in which a plurality of identical phantoms are fixedly mounted as an array in the running direction of the belt conveyor, and the electromagnetic field probes disposed within the respective phantoms assume a different position in each phantom.

7. The apparatus for measuring absorbed power according to claim 1 in which a plurality of identical phantoms are fixedly mounted as an array in the running direction of the belt conveyor, and the electromagnetic field probes disposed within the respective phantoms assume an identical position.

8. The apparatus for measuring absorbed power according to claim 1 in which the phantom has a configuration which simulates the configuration of the part of the human body.

9. The apparatus for measuring absorbed power according to claim 1, further comprising a position sensor mounted on the phantom for detecting whether or not the position sensor is located opposite to a radio transmitter acting as a radiation source of the irradiating radio wave.

10. The apparatus for measuring absorbed power according to claim 1, further comprising a radio anechoic box having two opposite openings for passing therethrough the phantom and the belt conveyer.

* * * * *